United States Patent
Cho et al.

(10) Patent No.: US 11,901,025 B2
(45) Date of Patent: Feb. 13, 2024

(54) SEMICONDUCTOR MEMORY DEVICE AND METHOD OF OPERATING SEMICONDUCTOR MEMORY DEVICE

(71) Applicant: Samsung Electronics Co., Ltd., Suwon-si (KR)

(72) Inventors: Seongjin Cho, Hwaseong-si (KR); Jungmin You, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/731,994

(22) Filed: Apr. 28, 2022

(65) Prior Publication Data

US 2023/0111467 A1    Apr. 13, 2023

(30) Foreign Application Priority Data

Oct. 12, 2021   (KR) .................. 10-2021-0134700

(51) Int. Cl.
*G11C 29/20* (2006.01)
*G11C 29/00* (2006.01)
*G11C 29/44* (2006.01)

(52) U.S. Cl.
CPC .......... *G11C 29/20* (2013.01); *G11C 29/4401* (2013.01); *G11C 29/783* (2013.01); *G11C 29/787* (2013.01)

(58) Field of Classification Search
CPC ... G11C 29/20; G11C 29/4401; G11C 29/783; G11C 29/787
See application file for complete search history.

(56) References Cited

U.S. PATENT DOCUMENTS 9,208,879 B2   12/2015   Lim
9,311,984 B1   4/2016   Hong et al.
(Continued)

FOREIGN PATENT DOCUMENTS

KR        100273256 B1   1/2001
KR    10-2016-0035444 A   3/2016
WO    WO-2021-169692 A1   9/2021

OTHER PUBLICATIONS

TW Office Action and Search Report dated Apr. 11, 2023 corresponding to Taiwanese Patent Application No. 111117825.

*Primary Examiner* — Mohammed A Bashar
(74) *Attorney, Agent, or Firm* — Harness, Dickey & Pierce, P.L.C.

(57) ABSTRACT

A semiconductor memory device includes a memory cell array including memory cell row, each of which includes volatile memory cells, a row hammer management circuit, a repair control circuit and a connection logic. The row hammer management circuit counts access addresses associated with the memory cell rows to store counting values, and determines a hammer address associated with least one of the memory cell rows, which is intensively accessed, based on the counting values. The repair control circuit includes repair controllers, each of which includes a defective address storage, and repairs a defective memory cell row among the memory cell rows. The connection logic connects first repair controllers, which are unused for storing defective addresses, among the plurality of repair controllers, to the row hammer management circuit. The row hammer management circuit uses the first repair controllers as a storage resource to store a portion of the access addresses.

20 Claims, 25 Drawing Sheets

(56) References Cited

U.S. PATENT DOCUMENTS

| | | |
|---|---|---|
| 9,449,671 B2 | 9/2016 | Crawford et al. |
| 10,121,526 B2 | 11/2018 | Vimercati et al. |
| 10,600,470 B2 | 3/2020 | Bang |
| 10,950,288 B2 | 3/2021 | Nale et al. |
| 11,087,821 B2 | 8/2021 | Son et al. |
| 2020/0058346 A1* | 2/2020 | Ito .......................... G11C 29/76 |
| 2021/0064743 A1 | 3/2021 | Hush et al. |
| 2021/0335411 A1* | 10/2021 | Wu ..................... G11C 11/4078 |
| 2022/0005544 A1 | 1/2022 | Zhang |
| 2022/0199144 A1* | 6/2022 | Roberts ................. G11C 11/408 |

\* cited by examiner

FIG. 18

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| ACT | L | L | L | R0 | R1 | R2 | R3 | BA0 | BA1 | BG0 | BG1 | BG2 | CID0 | CID1 | CID2 |
|  | H | R4 | R5 | R6 | R7 | R8 | R9 | R10 | R11 | R12 | R13 | R14 | R15 | R16 | CID3/R17 |
| WR | L | H | L | H | H | L | BL | BA0 | BA1 | BG0 | BG1 | BG2 | CID0 | CID1 | CID2 |
|  | H | V | C3 | C4 | C5 | C6 | C7 | C8 | C9 | C10 | V | H | L | V | CID3 |
| RD | L | H | L | H | H | H | BL | BA0 | BA1 | BG0 | BG1 | BG2 | CID0 | CID1 | CID2 |
|  | H | C2 | C3 | C4 | C5 | C6 | C7 | C8 | C9 | C10 | V | H | V | V | CID3 |

FIG. 19

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| PREab | L | H | H | L | H | L | CID3 | V | V | V | V | L | CID0 | CID1 | CID2 |
| PREsb | L | H | H | L | H | L | CID3 | BA0 | BA1 | V | V | H | CID0 | CID1 | CID2 |
| PREpb | L | H | H | L | H | L | CID3 | BA0 | BA1 | BG0 | BG1 | BG2 | CID0 | CID1 | CID2 |

SEMICONDUCTOR MEMORY DEVICE AND METHOD OF OPERATING SEMICONDUCTOR MEMORY DEVICE

CROSS-REFERENCE TO RELATED APPLICATIONS

This application claims the benefit of priority under 35 USC § 119 to Korean Patent Application No. 10-2021-0134700, filed on Oct. 12, 2021, in the Korean Intellectual Property Office, the disclosure of which is incorporated by reference in its entirety herein.

BACKGROUND

The present disclosure relates to memories, and more particularly to semiconductor memory devices to perform hammer refresh operation and methods of operating semiconductor memory devices.

A semiconductor memory device may be classified as a volatile memory device or a nonvolatile memory device. A volatile memory device refers to a memory device that loses data stored therein at power-off. As an example of a volatile memory device, a dynamic random access memory (DRAM) may be used in various devices such as a mobile system, a server, or a graphic device.

In volatile memory devices such as dynamic random access memory (DRAM) devices, cell charges stored in a memory cell may be lost by a leakage current. In addition, when a word-line is transitioned frequently between an active state and a precharged state (e.g., when the word-line has been accessed intensively or frequently), an affected memory cell connected to a word-line that is adjacent to the frequently accessed word-line may lose stored charges. Charges stored in a memory cell may be maintained by recharging before data is lost by leakage of cell charges. Such recharge of cell charges is referred to as a refresh operation, and a refresh operation may be performed repeatedly before cell charges are lost (potentially, significantly).

SUMMARY

Example embodiments may provide a semiconductor memory device configured to manage row hammer by using a portion of a repair control circuit as a storage resource to store access addresses.

Example embodiments may provide a method of operating a semiconductor memory device, configured to manage row hammer by using a portion of a repair control circuit as a storage resource to store access addresses.

According to example embodiments, a semiconductor memory device includes a memory cell array, a row hammer management circuit, a repair control circuit and a connection logic. The memory cell array includes a plurality of memory cell rows and each of the memory cell rows includes a plurality of volatile memory cells. The row hammer management circuit is configured to count each of access addresses associated with access to each of the plurality of memory cell rows to store counting values therein, and is configured to determine a hammer address associated with least one of the plurality of memory cell rows, which is intensively accessed, based on the counting values. The repair control circuit includes a plurality of repair controllers and each of the repair controllers includes a defective address storage. The repair control circuit is configured to repair a defective memory cell row among from the plurality of memory cell rows. The connection logic is configured to connect first repair controllers, which are unused for storing defective addresses, among the plurality of repair controllers, to the row hammer management circuit. The row hammer management circuit is configured to use the first repair controllers as a storage resource to store a portion of the access addresses.

According to example embodiments, in a method of operating a semiconductor memory device including a memory cell array that includes a plurality of memory cell rows, each of which including a plurality of volatile memory cells, a portion of access addresses are stored by using first repair controllers, which are unused for storing defective addresses, among from a plurality of repair controllers, each of which includes a defective address storage, a matching signal is generated, by at least one of the first repair controllers, based on a comparison of a target access address and stored access addresses therein, the matching signal is provided, by a connection logic, to a corresponding counter in a row hammer management circuit, a counting value of the corresponding counter in an access storage is stored by the row hammer management circuit, a hammer address is determined, by the row hammer management circuit, based on comparing the counting value with a reference number, and a hammer refresh operation is performed, by a refresh control circuit, on victim memory cell rows which are physically adjacent to a memory cell row corresponding to the hammer address.

According to example embodiments, a semiconductor memory device includes a memory cell array, a row hammer management circuit, a refresh control circuit, a repair control circuit and a connection logic. The memory cell array includes a plurality of memory cell rows and each of the memory cell rows includes a plurality of volatile memory cells. The row hammer management circuit is configured to count each of access addresses associated with access to each of the plurality of memory cell rows to store counting values therein, and is configured to determine a hammer address associated with least one of the plurality of memory cell rows, which is intensively accessed, based on the counting values. The refresh control circuit is configured to perform a refresh operation on the plurality of memory cell rows and a hammer refresh operation on victim memory cell rows which are physically adjacent to a memory cell row corresponding to the hammer address. The repair control circuit includes a plurality of repair controllers and each of the repair controllers includes a defective address storage. The repair control circuit is configured to repair a defective memory cell row among from the plurality of memory cell rows. The connection logic is configured to connect first repair controllers, which are unused for storing defective addresses, among the plurality of repair controllers, to the row hammer management circuit. The row hammer management circuit is configured to use the first repair controllers as a storage resource to store a portion of the access addresses.

Accordingly, in the semiconductor memory device and the method of operating the semiconductor memory device, a portion of repair controllers store access addresses for managing row hammer in access storage therein, and provide matching signals to corresponding counters in the row hammer management circuit through the connection logic based on comparing the target access address and the access addresses and the row hammer management circuit determines whether the target access address corresponds to a hammer address. Therefore, efficiency of row hammer management may be enhanced by storing more access addresses without increasing a size of the row hammer management circuit.

BRIEF DESCRIPTION OF THE DRAWINGS

Example embodiments will be described below in more detail with reference to the accompanying drawings.

FIGS. 18 and 19 illustrate example commands which may be used in the memory system of FIG. 1.

DETAILED DESCRIPTION

Various example embodiments will be described more fully hereinafter with reference to the accompanying drawings, in which example embodiments are shown.

Figure 1:
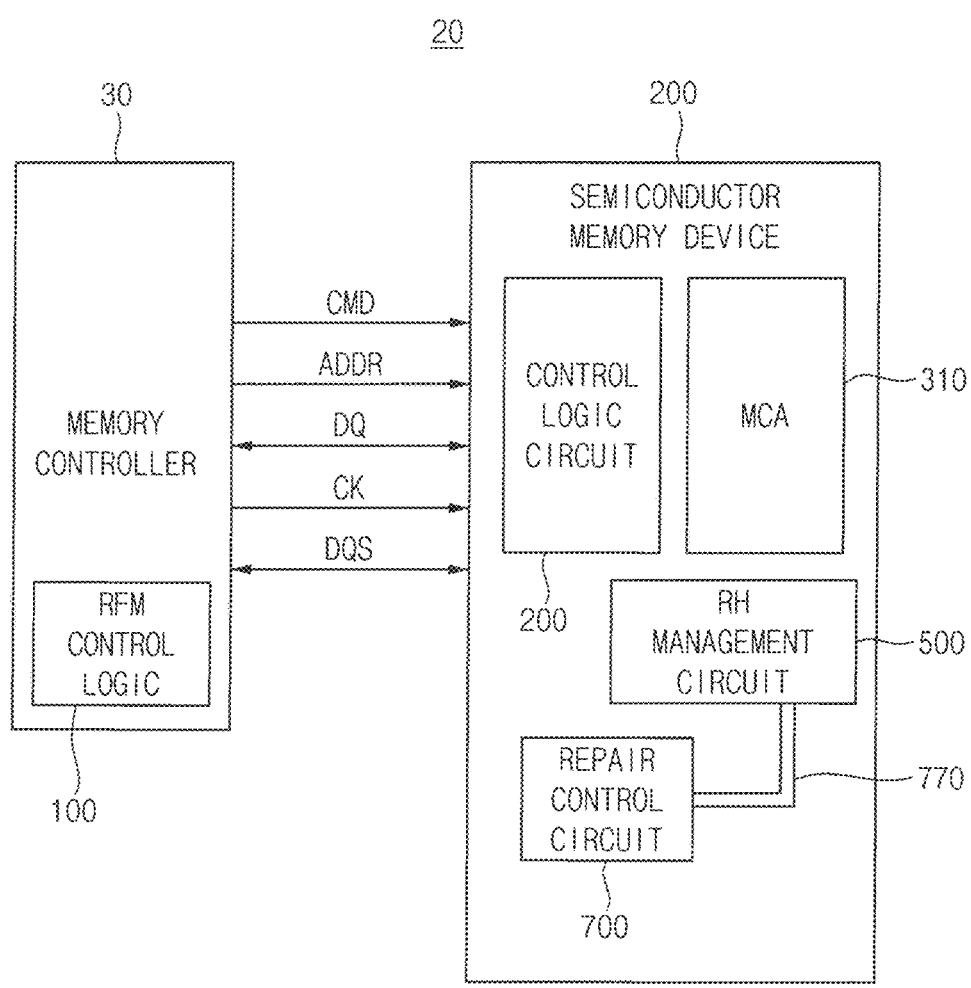
FIG. 1 is a block diagram illustrating a memory system according to example embodiments.

FIG. 1 is a block diagram illustrating a memory system according to example embodiments.

Referring to FIG. 1, a memory system 20 may include a memory controller 30 and/or a semiconductor memory device 200.

The memory controller 30 may control overall operation of the memory system 20. The memory controller 30 may control overall data exchange between an external host and the semiconductor memory device 200. For example, the memory controller 30 may write data in the semiconductor memory device 200 or read data from the semiconductor memory device 200 in response to request from the host.

In addition, the memory controller 30 may issue operation commands to the semiconductor memory device 200 for controlling the semiconductor memory device 200. In some example embodiments, the semiconductor memory device 200 is a memory device including dynamic memory cells such as a dynamic random access memory (DRAM), double data rate 5 (DDR5) synchronous DRAM (SDRAM), or a DDR6 SDRAM.

The memory controller 30 transmits a clock signal CK (the clock signal CK may be referred to a command clock signal), a command CMD, and/or an address (signal) ADDR to the semiconductor memory device 200. The memory controller 30 may exchange a data strobe signal DQS with the semiconductor memory device 200 when the memory controller 30 write data signal DQ in the semiconductor memory device 200 or reads data signal DQ from the semiconductor memory device 200. The address ADDR may be accompanied by the command CMD and the address ADDR may be referred to as an access address.

The memory controller 30 may include a refresh management (RFM) control logic 100 that generates a RFM command associated with a row hammer of the plurality of memory cell rows.

The semiconductor memory device 200 includes a memory cell array 310 that stores the data signal DQ, a control logic circuit 210, a row hammer (RH) management circuit 500, a repair control circuit 700 and/or a connection logic 770. The row hammer management circuit 500 and the repair control circuit 700 may be connected to each other by the connection logic 770.

The control logic circuit 210 may control operations of the semiconductor memory device 200. The memory cell array 310 may include a plurality of memory cell rows and each of the memory cell rows may include a plurality of volatile memory cells.

The row hammer management circuit 500 may count each of active numbers associated with the plurality of memory cell rows in response to an active command from the memory controller 30 to store counting values therein, and may determine a hammer address associated with least one of the plurality of memory cell rows, which is intensively accessed, based on the counting values.

The repair control circuit 700 may store defective addresses associated with defective memory cell rows having a defect and may perform a repair operation on the defective memory cell rows by outputting a repair address replacing an access address in response to the access address matching one of the defective addresses.

The repair control circuit 700 may include a plurality of repair controllers, and the row hammer management circuit 500 may use first repair controllers, which are unused for storing defective addresses, among from the plurality of repair controllers as a storage resource to store access addresses which are used for determining the hammer address. The connection logic 770 may connect the first repair controllers to the row hammer management circuit 500.

The row hammer management circuit 500 may use the first repair controllers as a storage resource to store a portion of the access addresses and thus may store more access addresses without increasing a size of the row hammer management circuit 500. Therefore, the row hammer management circuit 500 may increase performance and/or efficiency of row hammer management.

The semiconductor memory device 200 performs a refresh operation periodically due to charge leakage of memory cells storing data. Due to scale down of the manufacturing process of the semiconductor memory device 200, the storage capacitance of the memory cell may be decreased and/or the refresh period may be shortened. The refresh period may be further shortened because the entire refresh time is increased as the memory capacity of the semiconductor memory device 200 is increased.

To compensate for degradation of adjacent memory cells due to the intensive access to a particular row or a hammer address, a target row refresh (TRR) scheme was adopted and an in-memory refresh scheme is developed to reduce the burden of the memory controller 30. The memory controller 30 is totally responsible for the hammer refresh operation in the TRR scheme and the semiconductor memory device 200 is totally responsible for the hammer refresh operation in the in-memory refresh scheme.

The chip size overhead for the in-memory refresh may be serious as the memory capacity is increased and demands on low power consumption of the semiconductor memory device is increased. In addition, the power consumption may be increased because the semiconductor memory device has to handle the hammer refresh operation even though there is no intensive access. In addition, a row hammer of some of memory cell row selected from the plurality of the memory cell rows is managed.

In the memory system 20 according to example embodiments, the row hammer management circuit 500 may use a portion of the repair control circuit 700 as a store resource to store a portion of the access addresses.

Figure 2:
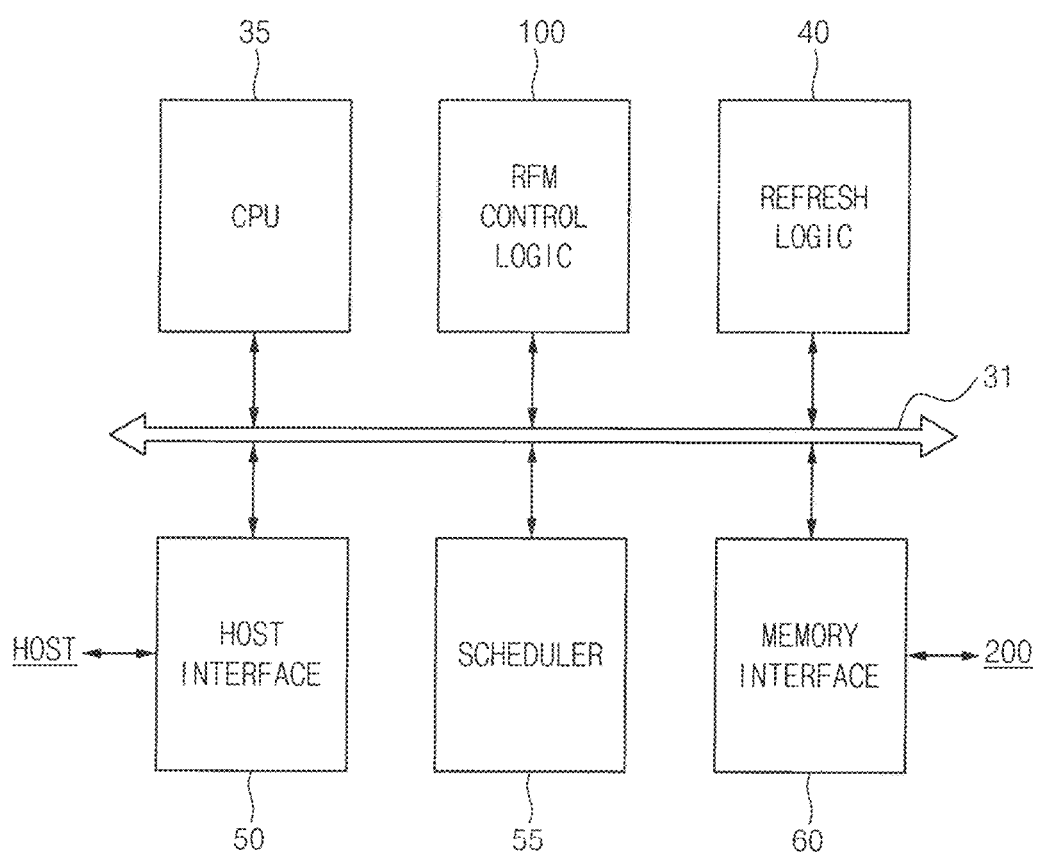
FIG. 2 is a block diagram illustrating the memory controller in FIG. 1 according to example embodiments.

FIG. 2 is a block diagram illustrating the memory controller in FIG. 1 according to example embodiments.

Referring to FIG. 2, the memory controller 30 may include a central processing unit (CPU) 35, the RFM control logic 100, a refresh logic 40, a host interface 50, a scheduler 55 and/or a memory interface 60 which are connected to each other through a bus 31.

The CPU 35 may control overall operation of the memory controller 30. The CPU 35 may control the RFM control logic t 100, the refresh logic 40, the host interface 50, the scheduler 55 and the memory interface 60.

The refresh logic 40 may generate auto refresh command for refreshing the plurality of memory cell rows based on a refresh interval of the semiconductor memory device 200.

The host interface 45 may perform interfacing with a host. The memory interface 60 may perform interfacing with the semiconductor memory device 200.

The scheduler 55 may manage scheduling and transmission of sequences of commands generated in the memory controller 30. The scheduler 55 may transmit the active command and subsequent commands to the semiconductor memory device 200 via the memory interface 60 and the semiconductor memory device 200 may manage the row hammer of the memory cell rows based on active counts of at least some of the memory cell rows.

Figure 3:
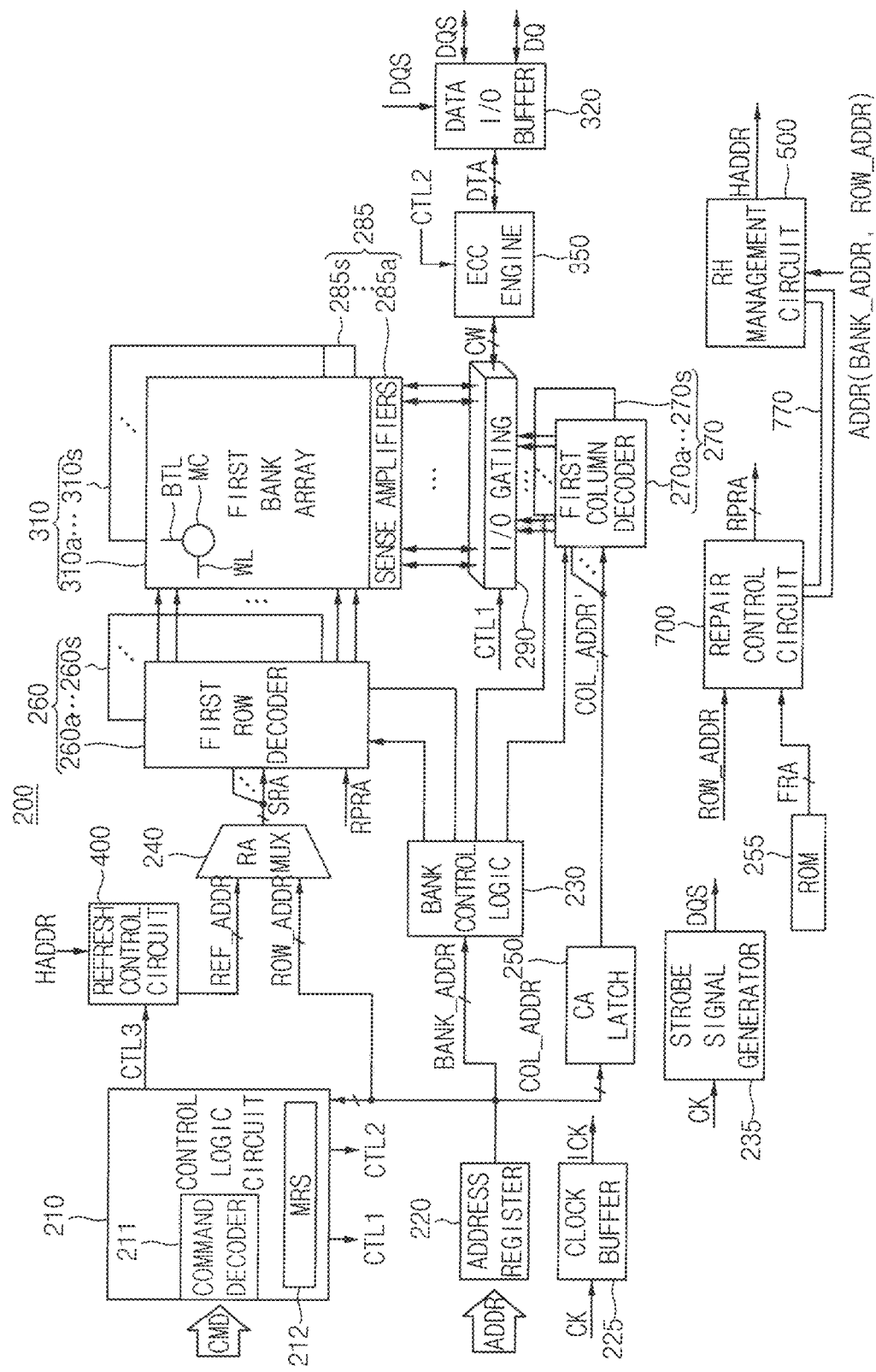
FIG. 3 is a block diagram illustrating an example of the semiconductor memory device in FIG. 1 according to example embodiments.

FIG. 3 is a block diagram illustrating an example of the semiconductor memory device in FIG. 1 according to example embodiments.

Referring to FIG. 3, the semiconductor memory device 200 may include the control logic circuit 210, an address register 220, a bank control logic 230, a refresh control circuit 400, a row address multiplexer 240, a column address latch 250, a nonvolatile storage 255 such as a ROM, a row decoder 260, a column decoder 270, the memory cell array 310, a sense amplifier unit 285, an I/O gating circuit 290, an error correction code (ECC) engine 350, a clock buffer 225, a strobe signal generator 235, a data I/O buffer 320, the row hammer management circuit 500, the repair control circuit 700 and/or the connection logic 770.

The memory cell array 310 may include first through sixteenth bank arrays 310a-310s. The row decoder 260 may include first through sixteenth row decoders 260a-260s respectively coupled to the first through sixteenth bank arrays 310a-310s, the column decoder 270 may include first through sixteenth column decoders 270a-270s respectively coupled to the first through sixteenth bank arrays 310a-310s, and the sense amplifier unit 285 may include first through sixteenth sense amplifiers 285a-285s respectively coupled to the first through sixteenth bank arrays 310a-310s.

The first through sixteenth bank arrays 310a-310s, the first through sixteenth row decoders 260a-260s, the first through sixteenth column decoders 270a-270s and first through sixteenth sense amplifiers 285a-285s may form first through sixteenth banks. Each of the first through sixteenth bank arrays 310a-310s includes a plurality of memory cells MC formed at intersections of a plurality of word-lines WL and a plurality of bit-line BTL.

The address register 220 may receive the address ADDR including a bank address BANK_ADDR, a row address ROW_ADDR and a column address COL_ADDR from the memory controller 30. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through sixteenth row decoders 260a-260s corresponding to the bank address BANK_ADDR is activated in response to the bank control signals, and one of the first through sixteenth column decoders 270a-270s corresponding to the bank address BANK_ADDR is activated in response to the bank control signals.

The row address multiplexer 240 may receive the row address ROW_ADDR from the address register 220, and may receive a refresh row address REF_ADDR from the refresh control circuit 400. The row address multiplexer 240 may selectively output the row address ROW_ADDR or the refresh row address REF_ADDR as a row address SRA. The row address SRA that is output from the row address multiplexer 240 is applied to the first through sixteenth row decoders 260a-260s.

The refresh control circuit 400 may sequentially increase or decrease the refresh row address REF_ADDR in a normal refresh mode in response to a third control signal CTL3 from the control logic circuit 210. The refresh control circuit 400 may receive a hammer address HADDR in a hammer refresh mode, and may output hammer refresh row addresses designating victim memory cell rows physically adjacent to a memory cell row corresponding to the hammer address HADDR as the refresh row address REF_ADDR.

The activated one of the first through sixteenth row decoders 260a-260s, by the bank control logic 230, may decode the row address SRA that is output from the row address multiplexer 240, and may activate a word-line corresponding to the row address SRA. For example, the activated bank row decoder applies a word-line driving voltage to the word-line corresponding to the row address.

The column address latch 250 may receive the column address COL_ADDR from the address register 220, and may temporarily store the received column address COL_ADDR. In some example embodiments, in a burst mode, the column address latch 250 may generate column address COL_ADDR' that increment from the received column address COL_ADDR. The column address latch 250 may apply the temporarily stored or generated column address COL_ADDR' to the first through sixteenth column decoders 270a-270s.

The activated one of the first through sixteenth column decoders 270a-270s activates a sense amplifier corresponding to the bank address BANK_ADDR and the column address COL_ADDR through the I/O gating circuit 290.

The I/O gating circuit 290 may include a circuitry for gating input/output data, and may further include input data mask logic, read data latches for storing data that is output from the first through sixteenth bank arrays 310a-310s, and write drivers for writing data to the first through sixteenth bank arrays 310a-310s.

Codeword CW read from one bank array of the first through sixteenth bank arrays 310a-310s is sensed by a sense amplifier coupled to the one bank array from which the data is to be read, and is stored in the read data latches. The codeword CW stored in the read data latches may be provided to the data I/O buffer 320 as data DTA after ECC decoding is performed on the codeword CW by the ECC engine 350. The data I/O buffer 320 may convert the data DTA into the data signal DQ and may transmit the data signal DQ along with the data strobe signal DQS to the memory controller 30.

The data signal DQ to be written in one bank array of the first through sixteenth bank arrays 310a-310s may be provided to the data I/O buffer 320 from the memory controller 30. The data I/O buffer 320 may convert the data signal DQ to the data DTA and may provide the data DTA to the ECC engine 350. The ECC engine 350 may perform an ECC encoding on the data DTA to generate parity bits, and the ECC engine 350 may provide the codeword CW including data DTA and the parity bits to the I/O gating circuit 290. The I/O gating circuit 290 may write the codeword CW in a sub-page in one bank array through the write drivers.

The data I/O buffer 320 may provide the data signal DQ from the memory controller 30 to the ECC engine 350 by converting the data signal DQ to the data DTA in a write operation of the semiconductor memory device 200 and may convert the data DTA to the data signal DQ from the ECC engine 350 and may transmit the data signal DQ and the data strobe signal DQS to the memory controller 30 in a read operation of the semiconductor memory device 200.

The ECC engine 350 may perform an ECC encoding and an ECC decoding on the data DTA based on a second control signal CTL2 from the control logic circuit 210.

The clock buffer 225 may receive the clock signal CK, may generate an internal clock signal ICK by buffering the clock signal CK, and may provide the internal clock signal ICK to circuit components processing the command CMD and the address ADDR.

The strobe signal generator 235 may receive the clock signal CK, may generate the data strobe signal DQS based on the clock signal CK and may provide the data strobe signal DQS to the data I/O buffer 320.

The nonvolatile storage 255 may store defective addresses (defective row addresses) FRA and may provide the defective addresses FRA to the repair control circuit 700 during a power-up sequence of the semiconductor memory device 200, in which a power is applied to the semiconductor memory device 200.

The repair control circuit 700, in response to the access row address ROW_ADDR matching one of the defective addresses FRA, may output a repair row address RPRA replacing the access row address ROW_ADDR and may provide the repair row address RPRA to one of the first through sixteenth row decoders 260a-260s.

The row hammer management circuit 500 may count active numbers of the memory cell rows based on the bank address BANK_ADDR and the row address ROW_ADDR which are accompanied by an active command from the memory controller 30 to store counting values therein, and may determine the hammer address HADDR associated with least one of the plurality of memory cell rows, which is intensively accessed, based on the counting values. The row hammer management circuit 500 may provide the hammer address HADDR to the refresh control circuit 400.

The connection logic 770 may connect first repair controllers, which are unused for storing defective addresses, among from the plurality of repair controllers to the row hammer management circuit 500.

The control logic circuit 210 may control operations of the semiconductor memory device 200. For example, the control logic circuit 210 may generate control signals for the semiconductor memory device 200 in order to perform a write operation, a read operation, a normal refresh operation and/or a hammer refresh operation. The control logic circuit 210 includes a command decoder 211 that decodes the command CMD received from the memory controller 100 and/or a mode register set (MRS) 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to the I/O gating circuit, the second control signal CTL2 to control the ECC engine 390 and the third control signal CTL3 to control the refresh control circuit 400.

Figure 4:
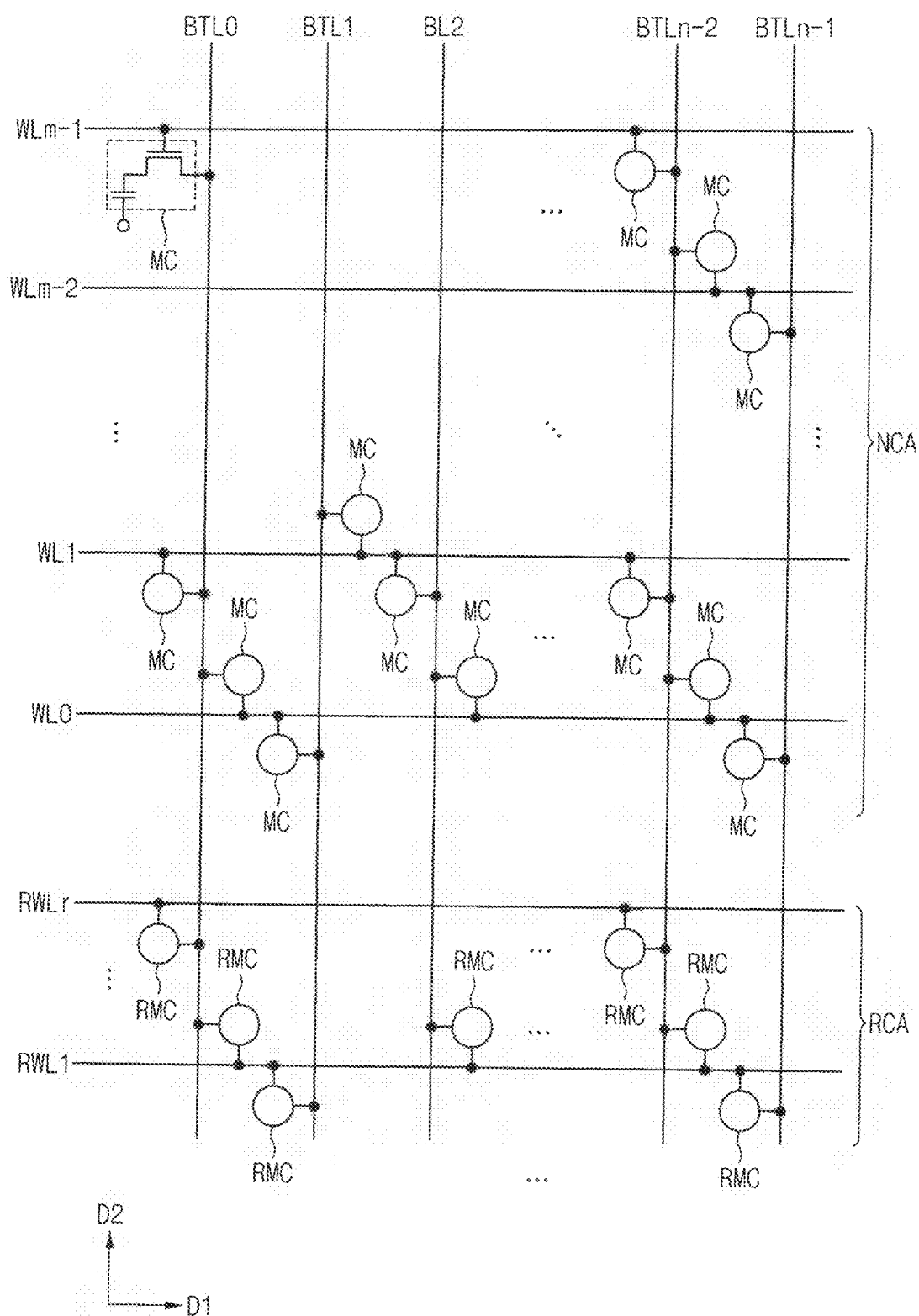
FIG. 4 illustrates an example of the first bank array in the semiconductor memory device of FIG. 3.

FIG. 4 illustrates an example of the first bank array in the semiconductor memory device of FIG. 3.

Referring to FIG. 4, the first bank array 310a includes a normal cell array NCA that includes a plurality of word-lines WL0~WLm-1 (m is a natural number greater than two), a plurality of bit-lines BTL0~BTLn-1 (n is a natural number greater than two), and a plurality of volatile memory cells MCs disposed at intersections between the word-lines WL0~WLm-1 and the bit-lines BTL0~BTLn-1. Each of the memory cells MCs includes a cell transistor coupled to each of the word-lines WL0~WLm-1 and each of the bit-lines BTL0~BTLn-1 and a cell capacitor coupled to the cell transistor. Each of the memory cells MCs may have a DRAM cell structure. The word-lines WL0~WLm-1 extend in a first direction D1 and the bit-lines BTL1~BTLn extend in a second direction D2 crossing the first direction D1.

In addition, the first bank array 310a further includes a redundancy cell array RCA that includes a plurality of redundancy word-lines SWL1~SWLr (r is a natural number greater than two), the plurality of bit-lines BTL0~BTLn-1, and a plurality of redundancy memory cells RMCs disposed at intersections between the redundancy word-lines SWL1~SWLr and the bit-lines BTL0~BTLn-1.

The word-lines WL0~WLm-1 coupled to the a plurality of memory cells MCs may be referred to as rows of the first bank array 310a and the bit-lines BTL0~BTLn-1 coupled to the a plurality of memory cells MCs may be referred to as columns of the first bank array 310a.

Figure 5:
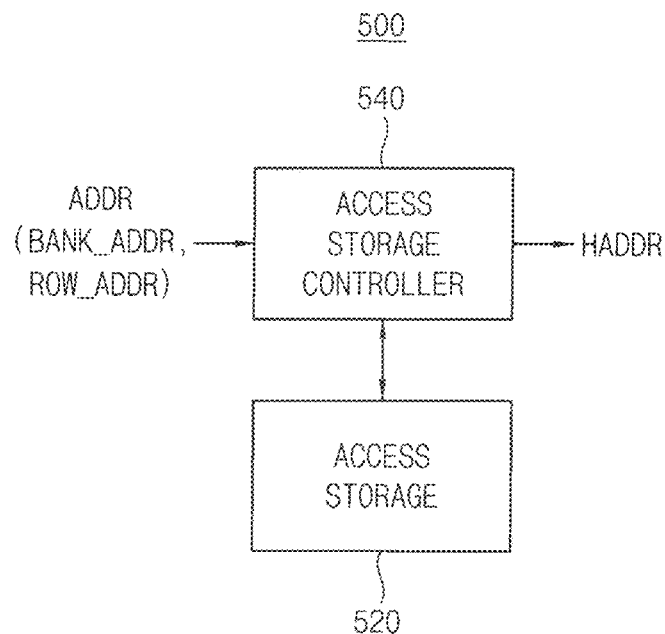
FIG. 5 is a block diagram illustrating an example of the row hammer management circuit in the semiconductor memory device of FIG. 3.
Figure 6:
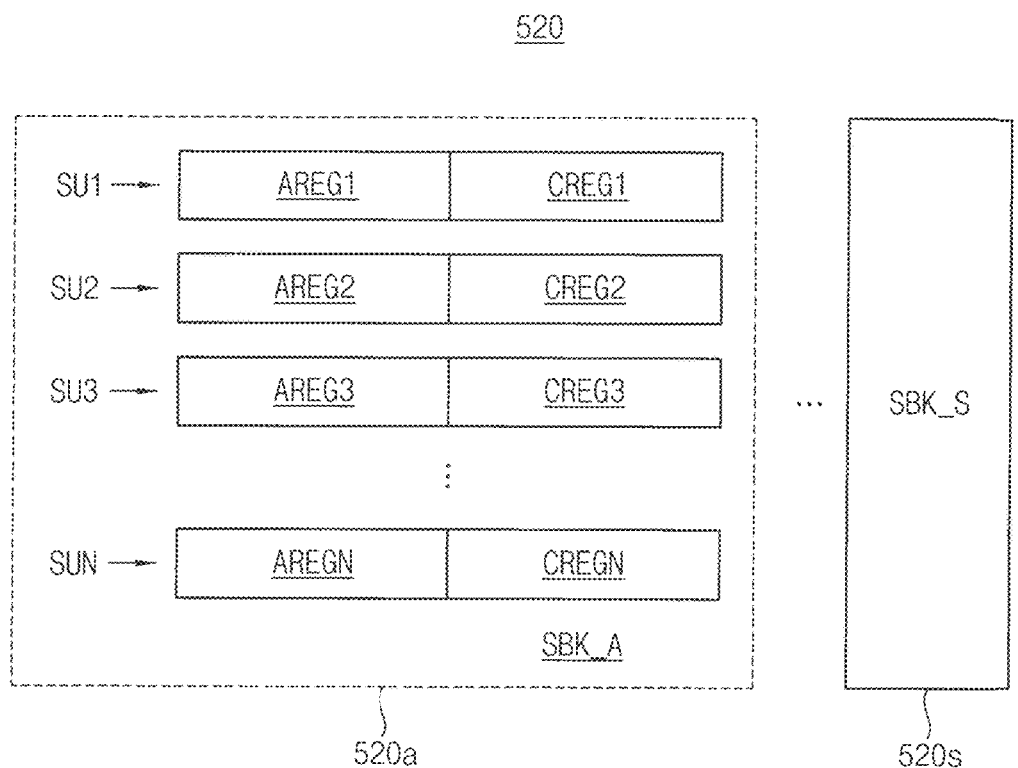
FIG. 6 is a diagram illustrating an example of an access storage included in the row hammer management circuit of FIG. 5 according to example embodiments.

FIG. 5 is a block diagram illustrating an example of the row hammer management circuit in the semiconductor memory device of FIG. 3, and FIG. 6 is a diagram illustrating an example of an access storage included in the row hammer management circuit of FIG. 5 according to example embodiments.

Referring to FIG. 5, the row hammer management circuit 500 may include an access storage 520 and/or an access storage controller 540.

The access storage 520 may store information on the hammer address HADD that is accessed intensively or frequently. In example embodiments, the access storage 520 may include a plurality of storage blocks SBK_A~SBK_S 520a-520s, and each of the storage blocks 520a-520s may include a plurality of storage units SU1~SUN as illustrated in FIG. 6. Here, s is an integer greater than two, and N is an integer greater than three. The storage blocks 520a-520s may have the same configuration and thus the one storage block 120a is described.

The storage units SU1~SUN may include address registers AREG1~AREGN storing the row addresses that are accessed and count registers CREG1~CREGN storing access counting values corresponding to the row addresses.

The access storage controller 540 may control the access storage 520 based on the access address ADDR from the memory controller 30. The access address ADDR may include a bank address BANK_ADDR and a row address ROW_ADDR. The access storage controller 520 may determine and provide the hammer address HADDR among the stored access addresses based on the access counting values.

Figure 7:
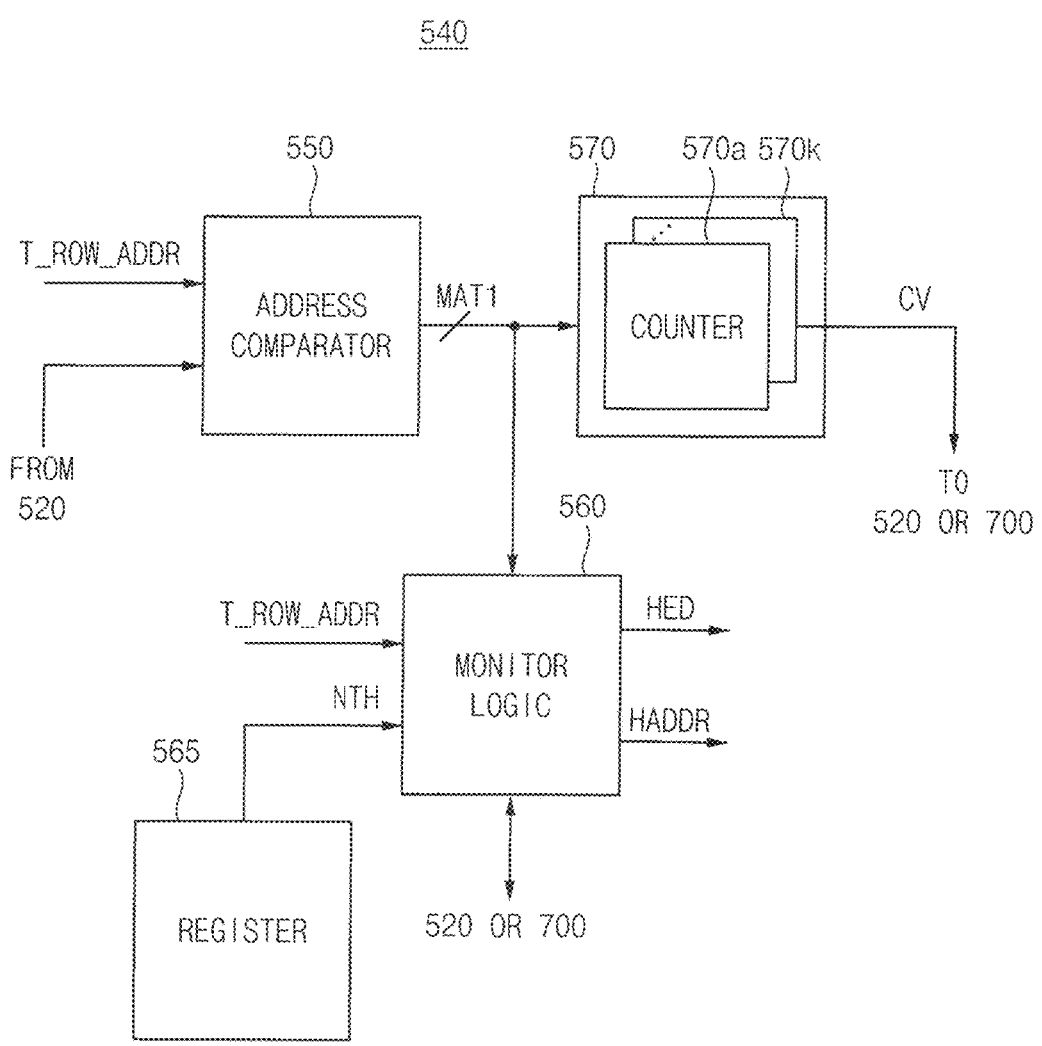
FIG. 7 is a block diagram illustrating an example of the access storage controller in FIG. 5 according to example embodiments.

FIG. 7 is a block diagram illustrating an example of the access storage controller in FIG. 5 according to example embodiments.

Referring to FIG. 7, the access storage controller 540 may include an address comparator 550, a counter circuit 570, a monitor logic 560 and/or a register 565. The counter circuit 570 may include a plurality of counters 570a-570k.

The address comparator 550 may compare a target row address T_ROW_ADDR of a target access address with a respective one of (previous) row addresses stored in the access storage 520 to generate a first matching signal MAT1 indicating whether the target row address T_ROW_ADDR matches a respective one of the previous row addresses. The target access address designates a memory cell row which is currently accessed among from the plurality of memory cell rows. The address comparator 550 may provide the first matching signal MAT1 to the monitor logic 560 and the counter circuit 570. The first matching signal MAT1 may include a plurality of bits and one of the plurality of bits may have a logic high level when the target row address T_ROW_ADDR matches one of the previous row addresses.

One of the plurality of counters 570a-570k may increase a counting value (e.g., access counting value) CV corresponding to the target row address T_ROW_ADDR in the access storage 520 or one of first repair controllers in the repair control circuit 700 in response to one of the plurality of bits in first matching signal MAT1 having a non-zero value.

The register 565 may store a reference number NTH and may provide the reference number NTH to the monitor logic 560.

The monitor logic 560 may be connected to the access storage 520 or the first repair controllers in the repair control circuit 700, in response to one of the plurality of bits in the first matching signal MAT1 having a non-zero value, may compare the counting value CV of the target row address T_ROW_ADDR, which is stored in the access storage 520 or in the first repair controllers in the repair control circuit 700, with the reference number NTH, may determine whether the target row address T_ROW_ADDR corresponds to the hammer address based on the comparison, and may generate a hammer event detection signal HED indicating that a hammer event occurs.

When the counting value of the target row address T_ROW_ADDR is smaller than the reference number NTH, the monitor logic 560 may not provide the hammer address HADDR to the refresh control logic 400.

In response to the counting value of the target row address T_ROW_ADDR being equal to or greater than reference number NTH, the monitor logic 560 may provide the hammer address HADDR to the refresh control circuit 400.

The monitor logic 560, in response to the plurality of bits in the first matching signal MAT1 having zero values, may store the target row address T_ROW_ADDR in the access storage 520 or in one of the first repair controllers and increase the counting value of the target row address T_ROW_ADDR to 'one'.

A number of the plurality of counters 570a-570k may correspond to a number of a plurality of repair controllers in the repair control circuit 700.

Figure 8:
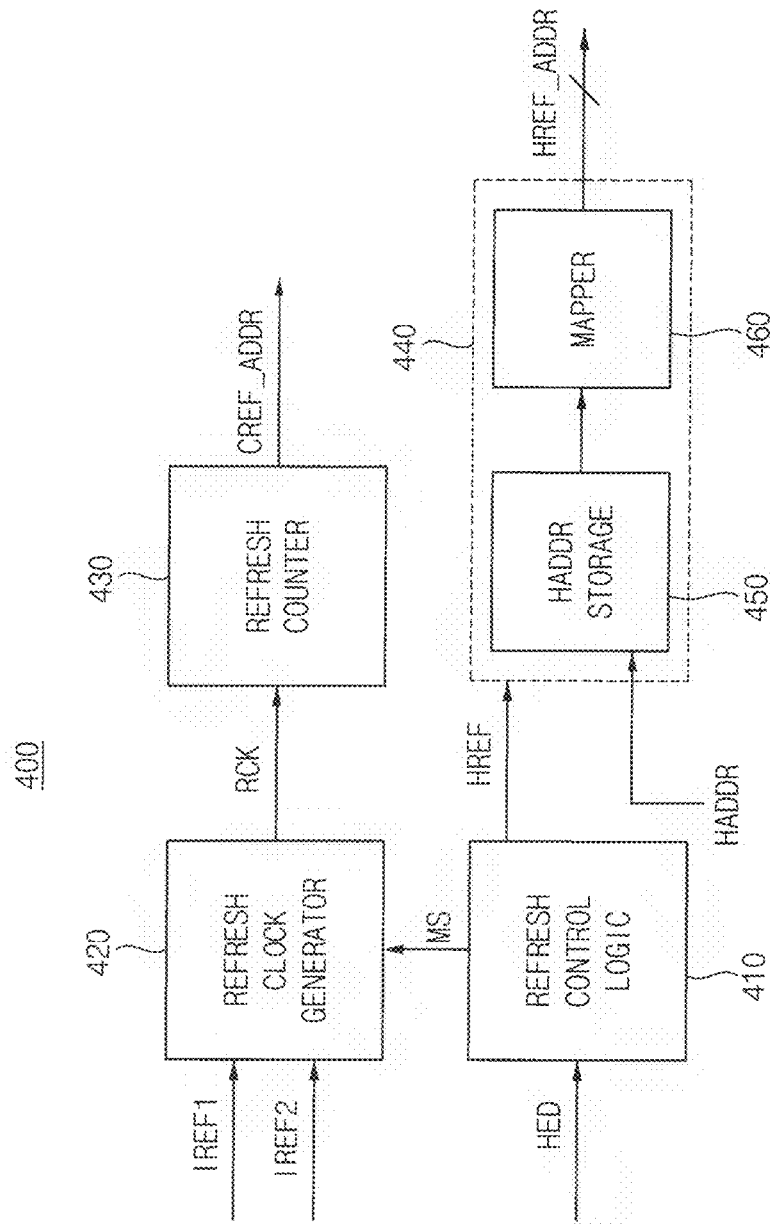
FIG. 8 is a block diagram illustrating an example of the refresh control circuit in FIG. 3 according to example embodiments.

FIG. 8 is a block diagram illustrating an example of the refresh control circuit in FIG. 3 according to example embodiments.

Referring to FIG. 8, the refresh control circuit 400 may include a refresh control logic 410, a refresh clock generator 420, a refresh counter 430 and/or a hammer refresh address generator 440.

The refresh control logic 410 may provide a mode signal MS in response to the hammer event detection signal HED. In addition, the refresh control logic 410 may provide the hammer refresh address generator 440 with a hammer refresh signal HREF to control output timing of the hammer address in response to one of the first refresh control signal IREF1 and the second refresh control signal IREF2.

The refresh clock generator 420 may generate a refresh clock signal RCK indicating a timing of a normal refresh operation based on the first refresh control signal IREF1, the second refresh control signal IREF2 and the mode signal MS. The refresh clock generator 420 may generate the refresh clock signal RCK in response to the receiving the first refresh control signal IREF1 or during the second refresh control signal IREF2 is activated.

When the command CMD from the memory controller 30 corresponds to an auto refresh command, the control logic circuit 210 in FIG. 3 may apply the first refresh control signal IREF1 to the refresh control circuit 400 whenever the control logic circuit 210 receives the auto refresh command. When the command CMD from the memory controller 30 corresponds to a self-refresh entry command, the control logic circuit 210 may apply the second refresh control signal IREF2 to the refresh control circuit 400 and the second refresh control signal IREF2 is activated from a time point when the control logic circuit 210 receives the self-refresh entry command to a time point when control logic circuit 210 receives a self-refresh exit command.

The refresh counter 430 may generate a counter refresh address CREF_ADDR designating sequentially the memory cell rows by performing counting operation at the period of the refresh clock signal RCK, and may provide the counter refresh address CREF_ADDR as the refresh row address REF_ADDR to the row address multiplexer 240 in FIG. 3.

The hammer refresh address generator 440 may include a hammer address storage 450 and/or a mapper 460.

The hammer address storage 450 may store the hammer address HADDR and may output the hammer address HADDR to the mapper 460 in response to the hammer refresh signal HREF. The mapper 460 may generate hammer refresh addresses HREF_ADDR designating victim memory cell rows physically adjacent to a memory cell row corresponding to the hammer address HADDR.

The hammer refresh address generator 440 may provide the hammer refresh address HREF_ADDR as the refresh row address REF_ADDR to the row address multiplexer 240 in FIG. 3.

The first refresh signal IREF1 and the second refresh signal IREF2 may be included in the third control signal CTL3 in FIG. 3.

Figure 9:
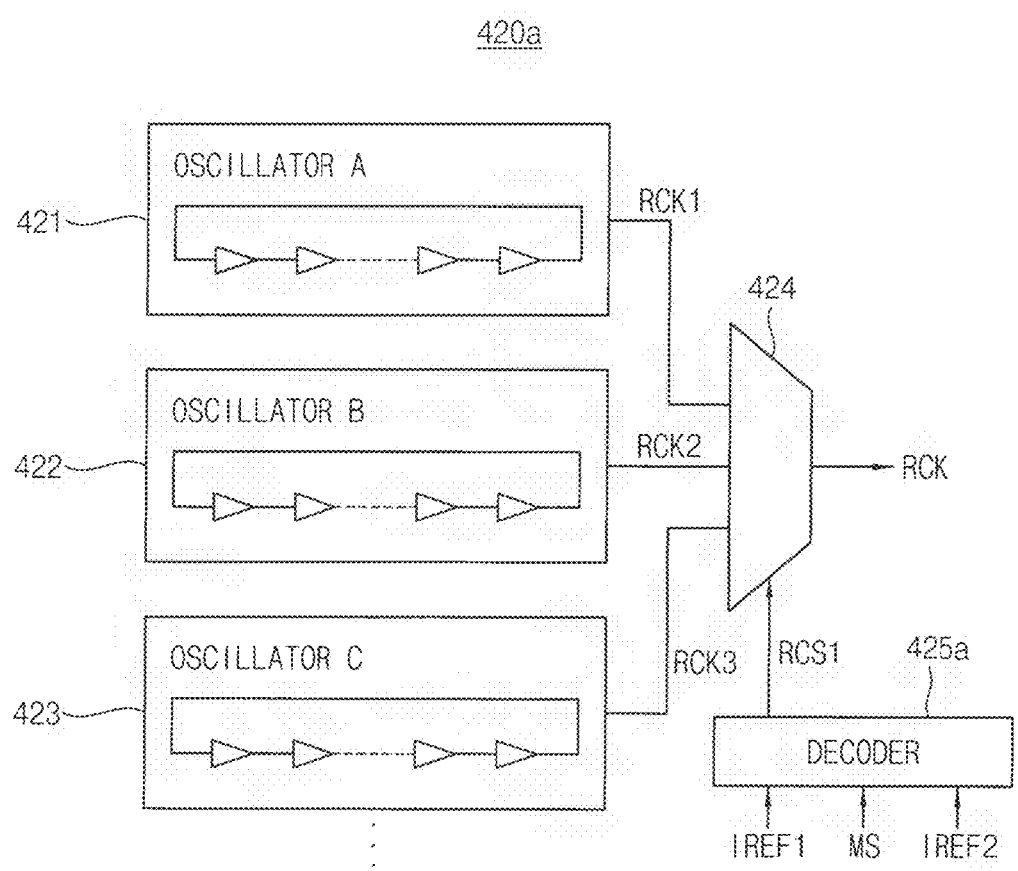
FIG. 9 is a circuit diagram illustrating an example of the refresh clock generator shown in FIG. 8 according to example embodiments.

FIG. 9 is a circuit diagram illustrating an example of the refresh clock generator shown in FIG. 8 according to example embodiments.

Referring to FIG. 9, a refresh clock generator 420a may include a plurality of oscillators 421, 422 and 423, a multiplexer 424 and/or a decoder 425a. The decoder 425a may decode the first refresh control signal IREF1, the second refresh control signal IREF2 and the mode signal MS to output a clock control signal RCS1. The oscillators 421, 422, and 423 generate refresh clock signals RCK1, RCK2 and RCK3 having different periods. The multiplexer 424 selects one of the refresh clock signals RCK1, RCK2 and RCK3 to provide the refresh clock signal RCK in response to the clock control signal RCS1.

Because the mode signal MS indicates that the row hammer event occurs, the refresh clock generator 420a may adjust a refresh cycle by selecting one of the refresh clock signals RCK1, RCK2 and RCK3.

Figure 10:
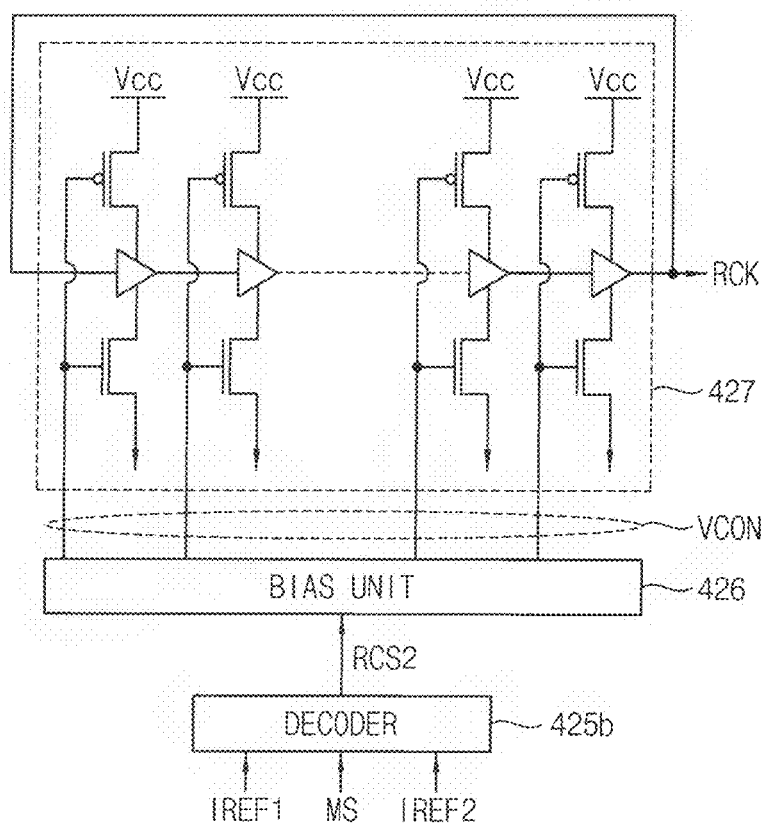
FIG. 10 is a circuit diagram illustrating another example of the refresh clock generator in FIG. 8 according to example embodiments.

FIG. 10 is a circuit diagram illustrating another example of the refresh clock generator in FIG. 8 according to example embodiments.

Referring to FIG. 10, a refresh clock generator 420b may include a decoder 425b, a bias unit 426 and/or an oscillator 427.

The decoder 425b may decode the first refresh control signal IREF1, the second refresh control signal IREF2 and the mode signal MS to output a clock control signal RCS2. The bias unit 426 generates a control voltage VCON in response to the clock control signal RCS2. The oscillator 427 generates the refresh clock signal RCK having a variable period, according to the control voltage VCON.

Because the mode signal MS indicates that the row hammer event occurs, the refresh clock generator 420b may adjust a refresh cycle by varying a period of the refresh clock signal RCK based on the clock control signal RCS2.

Figure 11:
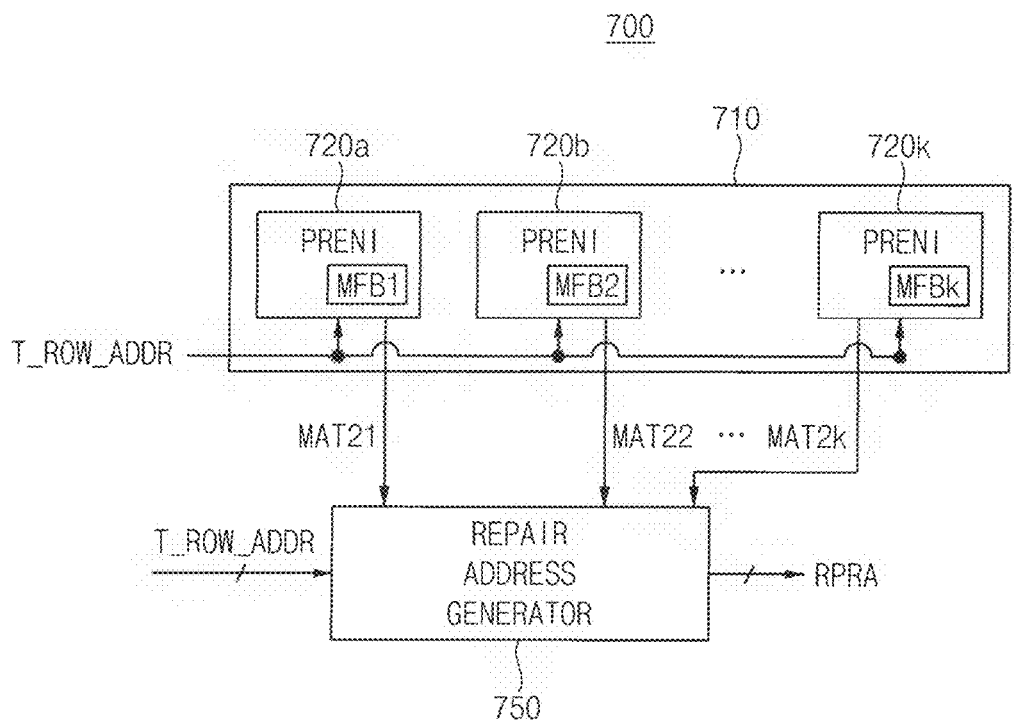
FIG. 11 is a block diagram illustrating an example of the repair control circuit in the semiconductor memory device of FIG. 3 according to example embodiments.

FIG. 11 is a block diagram illustrating an example of the repair control circuit in the semiconductor memory device of FIG. 3 according to example embodiments.

Referring to FIG. 11, the repair control circuit 700 may include a repair controller block 710 and/or a repair address generator 750.

The repair controller block 710 may include a plurality of repair controllers 720a, 720b, . . . , 720k (k is an integer greater than two). Each of the plurality of repair controllers 720a, 720b, . . . , 720k is denoted as PRENI meaning a redunancy enable. Each of the plurality of repair controllers 720a, 720b, . . . , 720k may compare the target row address T_ROW_ADDR, associated with a memory cell row which is currently accessed, with a corresponding defective address stored therein and may generate respective one of second matching signals MAT21, MAT22, . . . , MAT2k based on a result of the comparison. Each of the plurality of repair controllers 720a, 720b, . . . , 720k may store a respective one of master fuse bits MFB1, MFB2, . . . , MTBk, and each of which indicates whether the corresponding defective address is stored therein.

The repair address generator 750 may receive the target row address T_ROW_ADDR and may output the repair row address RPRA replacing the target row address T_ROW_ADDR based on the second matching signals MAT21, MAT22, . . . , MAT2k.

Figure 12:
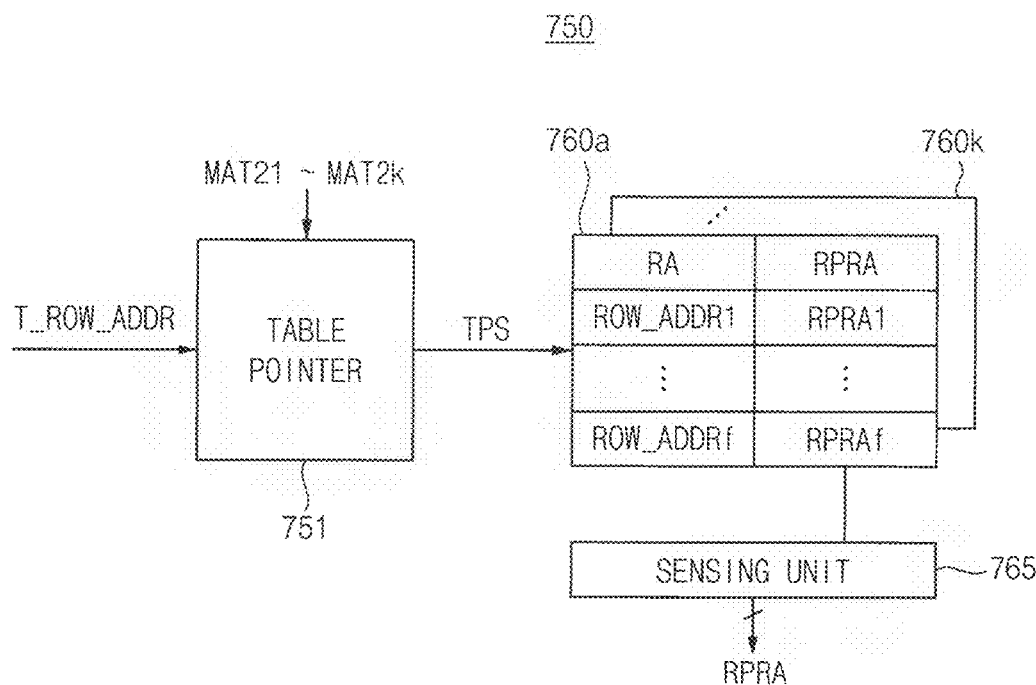
FIG. 12 is a block diagram illustrating an example of the repair address generator in the repair control circuit of FIG. 11 according to example embodiments.

FIG. 12 is a block diagram illustrating an example of the repair address generator in the repair control circuit of FIG. 11 according to example embodiments.

Referring to FIG. 12, the repair address generator 750 may include a table pointer 751, a plurality of storage tables 760a-760k and/or a sensing unit 765.

The table pointer 751 may generate a table pointing signal TPS based on the target row address T_ROW_ADDR. Each of the plurality of storage tables 760a-760k may store repair addresses RPRA1~PRPAf corresponding to row addresses ROW_ADDR1~ROW-ADDRf (f is an integer greater than one), and may output the repair row address RPRA replacing one of the row addresses ROW_ADDR1~ROW-ADDRf, which is associated with a matching signal having a high level among from the second matching signals MAT21, MAT22, . . . , MAT2k, based on the table pointing signal TPS and the second matching signals MAT21, MAT22, . . . , MAT2k, through the sensing unit 765.

Figure 13A:
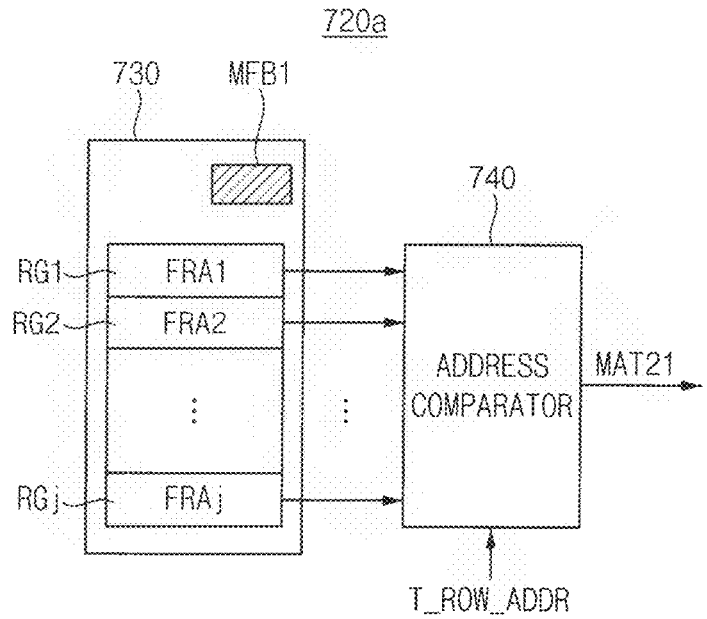
FIG. 13A is a block diagram illustrating an example of one of the repair controllers in the repair control circuit of FIG. 11 according to example embodiments.

FIG. 13A is a block diagram illustrating an example of one of the repair controllers in the repair control circuit of FIG. 11 according to example embodiments.

FIG. 13A illustrates a configuration of the repair controller 720a among the repair controllers 720a, 720b, . . . , 720k and each configuration of the repair controllers 720b, . . . , 720k may be the same as the configuration of the repair controller 720a.

Referring to FIG. 13A, the repair controller 720a may include a register set 730 and/or an address comparator 740. The address comparator 740 may be referred to as a second address comparator. The register set 730 may be referred to as a defective address storage.

The register set 730 may store the master fuse bit MFB1 and may include registers RG1~RGj (j is an integer greater than one) and each of the registers RG1~RGj may store a respective one of defective addresses FRA1~FRAj which are associated a specified region of the memory cell array 310. In FIG. 13A, the master fuse bit MFB1 indicates that the repair controller 720a is used for storing the defective addresses.

The address comparator 740 may compare the target row address T_ROW_ADDR with the defective addresses FRA1~FRAj to generate the second matching signal MAT21 in response to the target row address T_ROW_ADDR matching one of the defective addresses FRA1~FRAj. The address comparator 740 may provide the second matching signal MAT21 to the repair address generator 750 in FIG. 11.

Figure 13B:
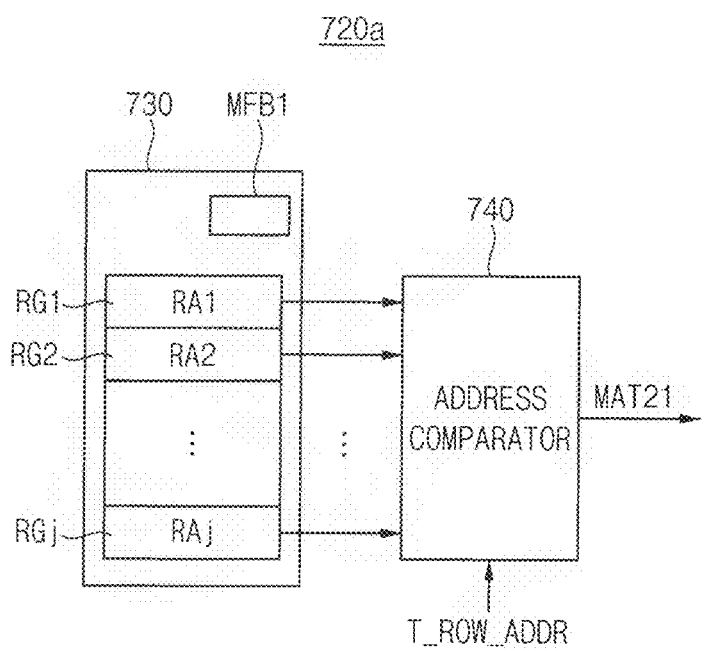
FIG. 13B is a block diagram illustrating an example of one of the repair controllers in the repair control circuit of FIG. 11 according to example embodiments.

FIG. 13B is a block diagram illustrating an example of one of the repair controllers in the repair control circuit of FIG. 11 according to example embodiments.

FIG. 13B illustrates a configuration of the repair controller 720a among the repair controllers 720a, 720b, . . . , 720k and each configuration of the repair controllers 720b, . . . , 720k may be the same as the configuration of the repair controller 720a.

Referring to FIG. 13B, the repair controller 720a may include a register set 730 and/or an address comparator 740. The address comparator 740 may be referred to as a second address comparator. The register set 730 may be referred to as a defective address storage.

The register set 730 may store the master fuse bit MFB1 and may include registers RG1~RGj (j is an integer greater than one) and each of the registers RG1~RGj may store a respective one of access addresses RA1~RAj which are associated a specified region of the memory cell array 310. In FIG. 13B, the master fuse bit MFB1 indicates that the repair controller 720a is unused for storing the defective addresses.

The address comparator 740 may compare the target row address T_ROW_ADDR with the access addresses RA1~RAj to generate the second matching signal MAT21 in response to the target row address T_ROW_ADDR matching one of the access addresses RA1~RAj. The address comparator 740 may provide the second matching signal MAT21 to a corresponding counter in the counter circuit 570 in FIG. 7 through the connection logic 770.

Figure 14:
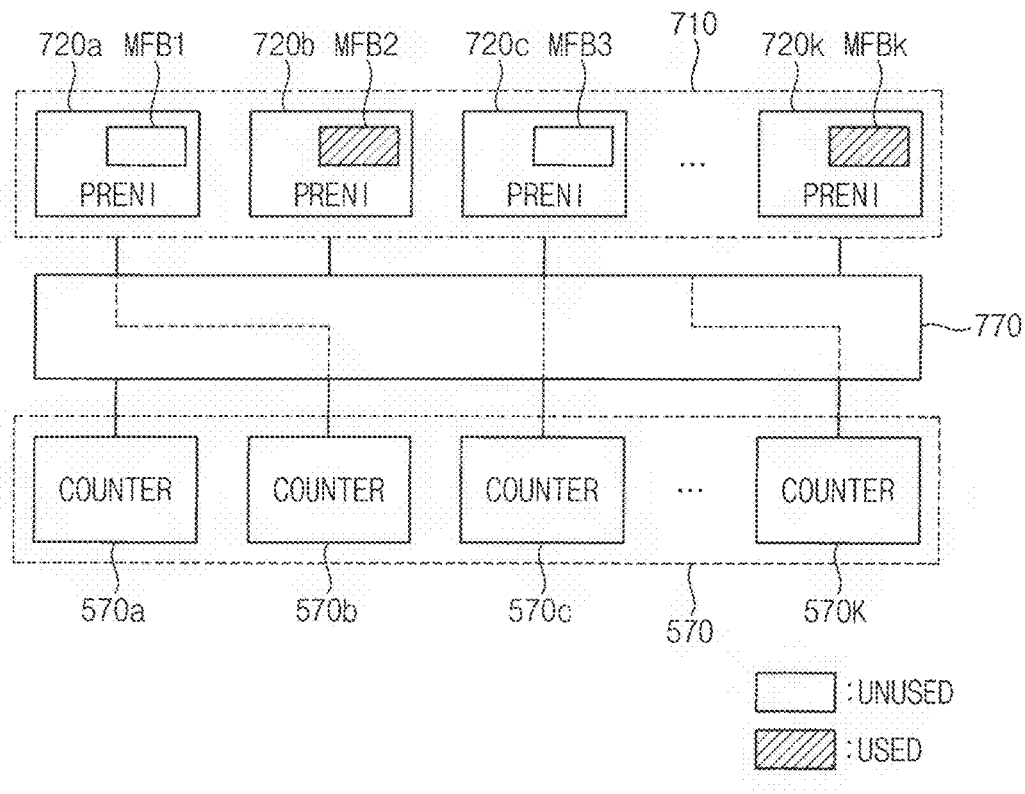
FIG. 14 illustrates the repair controllers in the repair control circuit and the counters in the row hammer management circuit in the semiconductor memory device of FIG. 3 according to example embodiments.

FIG. 14 illustrates the repair controllers in the repair control circuit and the counters in the row hammer management circuit in the semiconductor memory device of FIG. 3 according to example embodiments.

Referring to FIG. 14, the repair controller block 710 includes a plurality of repair controllers 720a, 720b, 720c, . . . , 720k and each of the repair controllers 720a, 720b, 720c, . . . , 720k stores a respective one of master fuse bits MFB1, MFB2, MFB3, . . . , MFBk. Hatched master fuse bits MFB2 and MFBk among the master fuse bits MFB1, MFB2, MFB3, . . . , MFBk indicate that the repair controllers 720b and 720k are used for storing associated defective addresses respectively and unhatched master fuse bits MFB1 and MFB3 among the master fuse bits MFB1, MFB2, MFB3, . . . , MFBk indicate that the repair controllers 720a and 720c are unused for storing defective addresses respectively. Therefore, the repair controllers 720a and 720c may store access addresses associated with memory regions of the memory cell array 310, may generate second matching signals by comparing the access addresses with a target row address and may provide the second matching signals to the connection logic 770.

The counter circuit 570 may include a plurality of counters 570a, 570b, 570c, . . . , 570k and the connection logic 770 may provide each of the second matching signals to the counters 570b and 570k respectively based on the master fuse bits MFB1, MFB2, MFB3, . . . , MFBk.

The connection logic 770 may identify the repair controllers 720a, 720b, 720c, . . . , 720k into first repair controllers, which are unused for storing defective addresses, and second repair controllers which are used for storing defective addresses based on the master fuse bits MFB1, MFB2, MFB3, . . . , MFBk. In FIG. 14, the repair controllers 720a and 720c correspond to the first repair controllers and the repair controllers 720b and 720k correspond to the second repair controllers.

Figure 15:
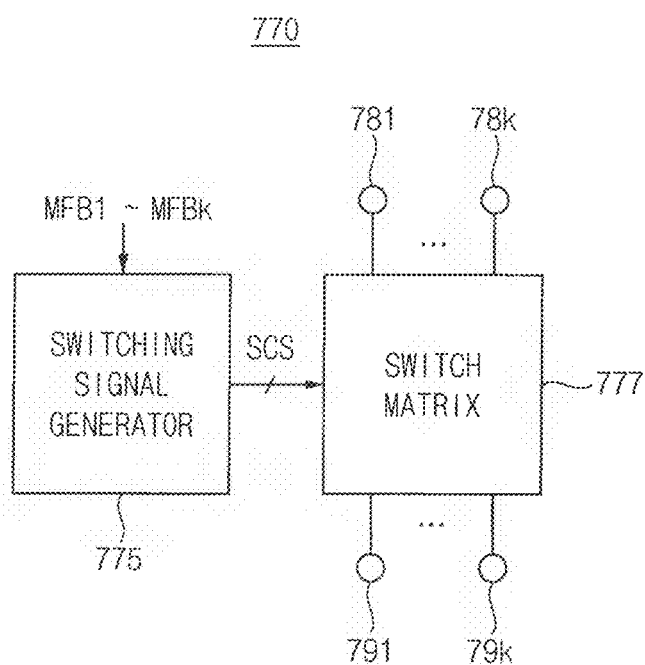
FIG. 15 is a block diagram illustrating an example of the connection logic in FIG. 14 according to example embodiments.

FIG. 15 is a block diagram illustrating an example of the connection logic in FIG. 14 according to example embodiments.

Referring to FIG. 15, the connection logic 770 may include a switching signal generator 775 and/or a switch matrix 777.

The switching signal generator 775 may generate a plurality of switching control signals SCS based on master fuse bits MFB1~MFBk. The switch matrix may include first terminals 781~78k connected to the plurality of repair controllers 720a, 720b, 720c, . . . , 720k and second terminals 791~79k connected to the plurality of counters 570a, 570b, 570c, . . . , 570k and may connect the first repair controllers to corresponding counters among from the plurality of counters 570a, 570b, 570c, . . . , 570k through the first terminals 781~78k and the second terminals 791~79k, based on switching control signals SCS by controlling mutual connection of the first terminals 781~78k and the second terminals 791~79k.

In example embodiments, the connection logic 770 may vary a number of the first repair controllers connected to a portion of the plurality of counters 570a, 570b, 570c, . . . , 570k based on the master fuse bits MFB1~MFBk. That is, the connection logic 770 may vary a number of the first repair controllers connected to the counters 570a, 570b, 570c, . . . , 570k based on storage capacity of the first repair controllers.

Figure 16:
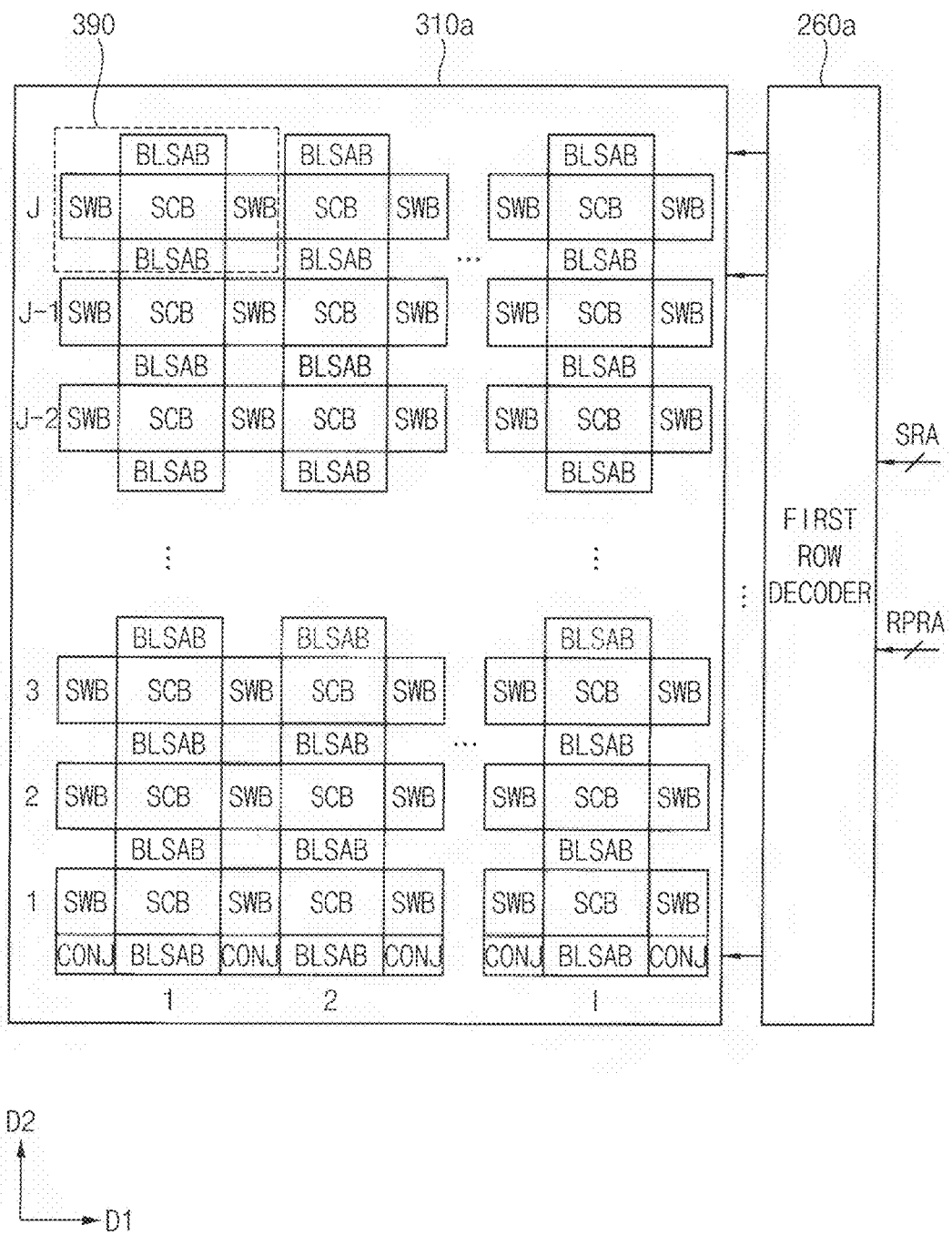
FIG. 16 is an example illustration of architecture of one bank array in the semiconductor memory device of FIG. 3.

FIG. 16 is an example illustration of architecture of one bank array in the semiconductor memory device of FIG. 3.

In FIG. 16, there are shown the first bank array 310a and a circuit associated with the first bank array 310a. In FIG. 16, there are illustrated the first bank array 310a and the first row decoder 260a.

Referring to FIG. 16, in the first bank array 310a, I sub-array blocks SCB may be disposed in the first direction D1, and J sub-array blocks SCB may be disposed in the second direction D2 substantially perpendicular to the first direction D1. I and J represent a number of the sub-array blocks SCB in the first direction D1 and the second direction D2, respectively, and are natural numbers greater than two.

I sub-array blocks SCB disposed in the first direction D1 in one row may be referred to as a row block. A plurality of bit-lines, a plurality of word-lines and a plurality of memory cells connected to the bit-lines and the word-lines are disposed in each of the sub-array blocks SCB.

I+1 sub word-line driver regions SWB may be disposed between the sub-array blocks SCB in the first direction D1 as well on each side of each of the sub-array blocks SCB in the first direction D1. Sub word-line drivers may be disposed in the sub word-line driver regions SWB. J+1 bit-line sense amplifier regions BLSAB may be disposed, for example between the sub-array blocks SCB in the second direction D2 and above and below each of the sub-array blocks SCB in the second direction D2. Bit-line sense amplifiers to sense data stored in the memory cells may be disposed in the bit-line sense amplifier regions BLSAB.

A plurality of sub word-line drivers may be provided in each of the sub word-line driver regions SWB. One sub word-line driver region SWB may be associated with two sub-array blocks SCB adjacent to the sub word-line driver region SWB in the first direction D1.

A plurality of conjunction regions CONJ may be disposed adjacent the sub word-line driver regions SWB and the bit-line sense amplifier regions BLSAB. A voltage generator is disposed in each of the conjunction regions CONJ. A portion 390 in the first bank array 310a may be described with reference to FIG. 17 below.

The first row decoder 260a may select one of the word-lines in the normal cell array NCA in FIG. 4 in response to the row address SRA being activated and may select one of the redundancy word-lines in the redundancy cell array RCA in FIG. 4 in response to the repair row address RPRA being activated.

In FIG. 14, respective one of the counters 570a, 570b, 570c, . . . , 570k and respective one of the repair controllers 720a, 720b, 720c, . . . , 720k may be associated with respective one of row blocks in FIG. 16. In addition, respective one of the counters 570a, 570b, 570c, . . . , 570k and respective one of the repair controllers 720a, 720b, 720c, . . . , 720k may be divided into a plurality of groups and each of the groups may correspond to respective one of the bank arrays 310a-310s. In some example embodiments, the row hammer management circuit 500 may use a first group of repair controllers corresponding to the first bank array 310a among from the plurality of bank arrays 310a-310s as a bank storage resource to store access addresses associated with the second bank array 310b among from the plurality of bank arrays 310a-310s.

Figure 17:
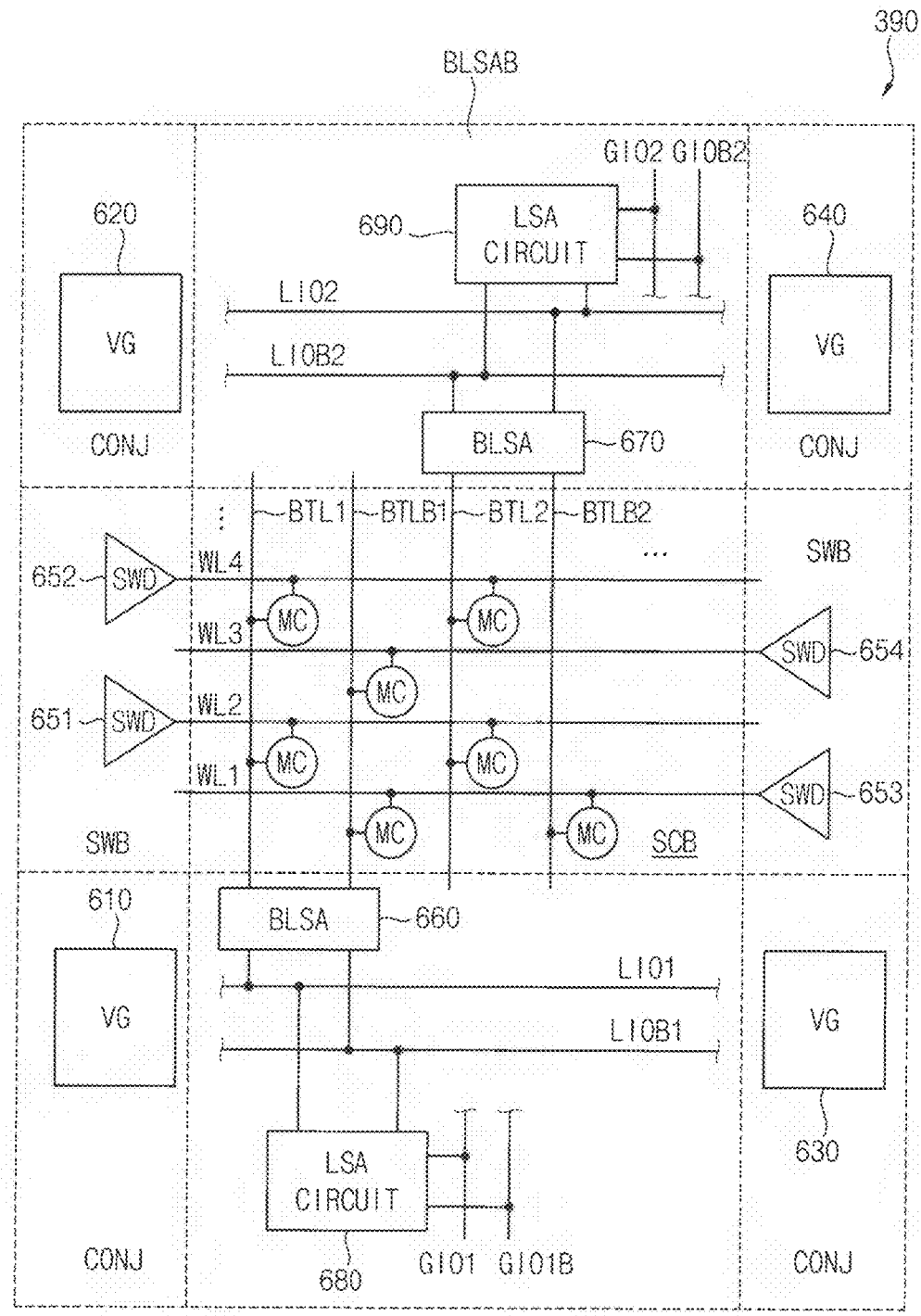
FIG. 17 illustrates a portion of the first bank array in FIG. 16 according to some example embodiments.

FIG. 17 illustrates a portion of the first bank array in FIG. 16 according to some example embodiments.

Referring to FIGS. 16 and 17, in the portion 390 of the first bank array 310a, the sub-array block SCB, two of the bit-line sense amplifier regions BLSAB, two of the sub word-line driver regions SWB and four of the conjunction regions CONJ are disposed.

The sub-array block SCB includes a plurality of word-lines WL1~WL4 extending in a row direction (the first direction D1) and a plurality of bit-line pairs BTL1~BTLB1 and BTL2~BTLB2 extending in a column direction (the second direction D2). The sub-array block SCB includes a plurality of memory cells MCs disposed at intersections of the word-lines WL1~WL4 and the bit-line pairs BTL1~BTLB1 and BTL2~BTLB2.

With reference to FIG. 17, the sub word-line driver regions SWB include a plurality of sub word-line drivers 651, 652, 653 and 654 that respectively drive the word-lines WL1~WL4. The sub word-line drivers 651 and 652 may be disposed in the sub word-line driver region SWB, which is leftward (in this example), with respect to the sub-array block SCB. In addition, the sub word-line drivers 653 and 654 may be disposed in the sub word-line driver region SWB, which is rightward (in this example), with respect to the sub-array block SCB.

The bit-line sense amplifier regions BLSAB include bit-line sense amplifiers 660 (BLSA) and bit-line sense amplifier 670 coupled to the bit-line pairs BTL1~BTLB1 and BTL2~BTLB2, and local sense amplifier circuit 680 and local sense amplifier circuit 690. The bit-line sense amplifier 660 may sense and amplify a voltage difference between the bit-line pair BTL1 and BTLB1 to provide the amplified voltage difference to a local I/O line pair LIO1 and LIOB1.

The local sense amplifier circuit 680 controls connection between the local I/O line pair LIO1 and LIOB1 and a global I/O line pair GIO1 and GIOB1. The local sense amplifier circuit 690 controls connection between the local I/O line pair LIO2 and LIOB2 and a global I/O line pair GIO2 and GIOB2.

As illustrated in FIG. 10, the bit-line sense amplifier 660 and the bit-line sense amplifier 670 may be alternately disposed at an upper portion and a lower portion of the sub-array block SCB. The conjunction regions CONJ are disposed adjacent to the bit-line sense amplifier regions BLSAB and the sub word-line driver regions SWB. The conjunction regions CONJ are also disposed at each corner of the sub-array block SCB in FIG. 17. A plurality of voltage generators 610, 620, 630 and 640 may be disposed in the conjunction regions CONJ.

FIGS. 18 and 19 illustrate example commands which may be used in the memory system of FIG. 1.

FIG. 18 illustrates combinations of a chip selection signal CS_n and first through fourteenth command-address signals CA0~CA13 representing an active command ACT, a write command WR and a read command RD, and FIG. 19 illustrates combinations of the chip selection signal CS_n and the first through fourteenth command-address signals CA0~CA13 representing precharge commands PREab, PREsb and PREpb.

In FIGS. 18 and 19, H indicates the logic high level, L indicates the logic low level, V indicates a valid logic level corresponding to one of the logic high level and the logic low level, R0~R17 indicate bits of a row address, BA0 through BA2 indicate bits of a bank address, and CID0 through CID3 indicate die identifier of a memory die when the semiconductor memory device 200 is implemented with a stacked memory device including a plurality of memory dies. In addition, in FIG. 14, C2~C10 indicate bits of a column address, and in FIG. 18, BL indicates burst length flag.

Referring to FIG. 18, the active command ACT, the write command WR and the read command RD may be transferred during two cycles, for example, during a high level and a low level of the chip selection signal CS_n. The active command ACT a may include the bank address bits BA0 and BA1 and the row address bits R0~R17.

In FIG. 19, PREpb is a precharge command to precharge a particular bank in a particular bank group, PREab is all bank precharge command to precharge all banks in all bank groups and PREsb is same bank precharge command to precharge same bank in all bank groups.

Referring to FIG. 19, the ninth command-address signal CA8 or the tenth command-address signal CA9 of each of the precharge commands PREab and PREsb may be uses as a flag to determine the hammer address.

Figure 20:
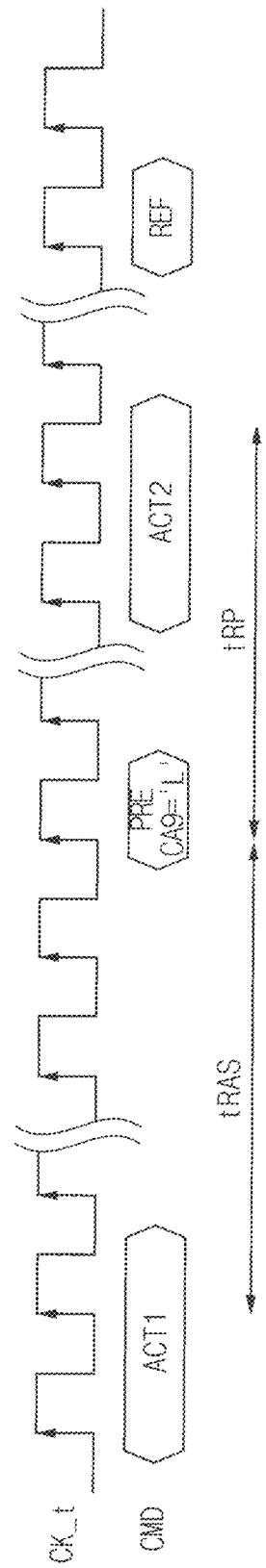
FIG. 20 illustrates an example of the command protocol of the memory system when the memory system determines a hammer address based on the precharge command.

FIG. 20 illustrates an example of the command protocol of the memory system when the memory system determines a hammer address based on the precharge command.

Referring to FIGS. 1, 2, 19 and 20, the scheduler 55 applies the first active command ACT1 to the semiconductor memory device 200 in synchronization with an edge of the clock signal CK_t, and applies the precharge command PRE designating whether a target memory cell row designated by a target row address corresponds to a hammer address, which is accompanied by the first active command ACT1, to the semiconductor memory device 200 after a tRAS corresponding to active to precharge time elapses. In some example embodiments, the scheduler 55 may set the tenth command-address signal CA9 of the precharge command PRE to a logic low level.

After a time interval corresponding to precharge time tRP, the scheduler 55 applies a second active command ACT2 to the semiconductor memory device 200 in synchronization with an edge of the clock signal CK_t and applies a refresh command REF to the semiconductor memory device 200. The semiconductor memory device 200 performs a hammer refresh operation on two victim memory cell rows physically adjacent to a memory cell row corresponding to the hammer address, in response to the refresh command REF.

Figure 21:
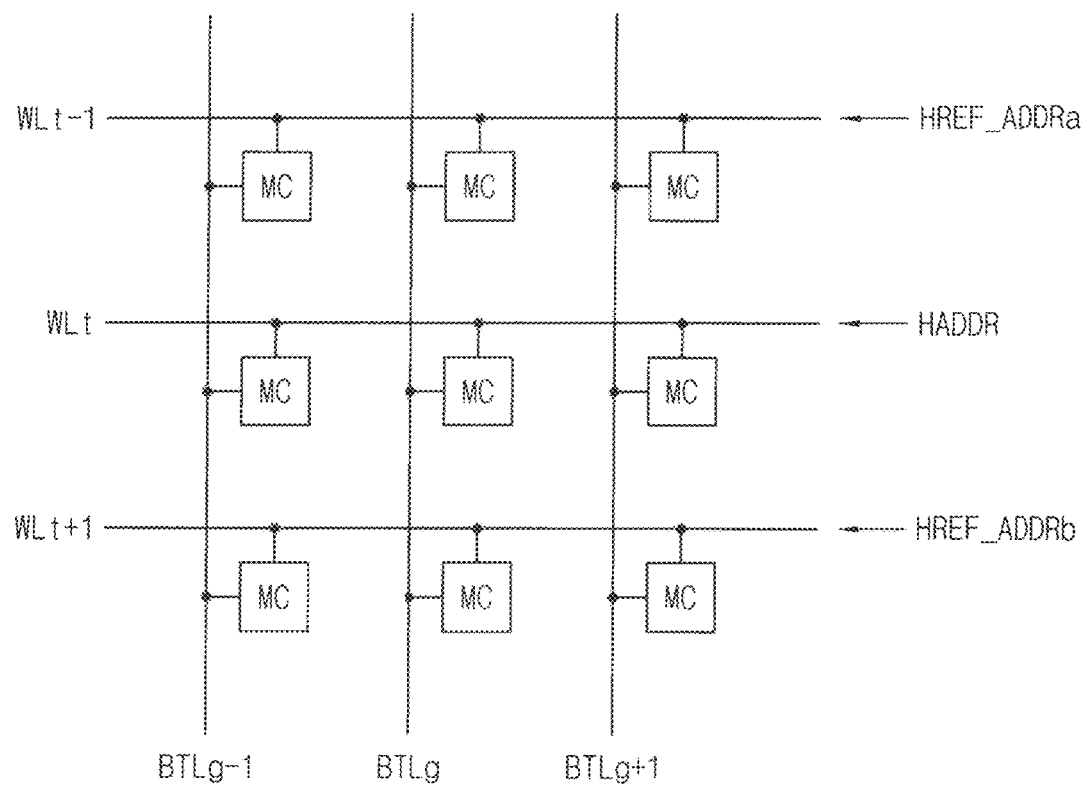
FIG. 21 is a diagram illustrating a portion of a memory cell array for describing generation of hammer refresh addresses.

FIG. 21 is a diagram illustrating a portion of a memory cell array for describing generation of hammer refresh addresses.

FIG. 21 illustrates three word-lines WLt−1, WLt and WLt+1, three bit-lines BLg−1, BLg and BLg+1 and memory cells MC coupled to the word-lines WLt−1, WLt and WLt+1 and the bit-lines BLg−1, BLg and BLg+1 in the memory cell array. The three word-lines WLt−1, WLt and WLt+1 are extended in a row direction (e.g., a first direction D1) and arranged sequentially along a column direction (e.g., a second direction D2). The three bit-lines BLg−1, BLg and BLg+1 are extended in the column direction and arranged sequentially along the row direction. It will be understood that the word-lines WLt−1 and WLt are physically directly adjacent to each other since there are no intervening word-lines between the word-lines WLt−1 and WLt.

For example, the middle word-line WLt may correspond to the hammer address HADDR that has been intensively accessed. It will be understood that "an intensively-accessed word-line" refers to a word-line that has a relatively higher activation number and/or has a relatively higher activation frequency. Whenever the hammer word-line (e.g., the middle word-line WLt) is accessed, the hammer word-line WLt is enabled and precharged, and the voltage level of the hammer word-line WLt is increased and decreased. Word-line coupling may cause the voltage levels of the adjacent word-lines WLt−1 and WLt+1 to fluctuate as the voltage level of the hammer word0line WLt varies, and thus the cell charges of the memory cells MC coupled to the adjacent word-lines WLt−1 and WLt+1 are affected. As the hammer word-line WLt is accessed more frequently, the cell charges of the memory cells MC coupled to the adjacent word-lines WLt−1 and WLt+1 may be lost more rapidly.

The hammer address generator 440 in FIG. 8 may provide the HREF_ADDR representing the addresses HREF_ADDRa and HREF-ADDRb of the rows (e.g., the word-lines WLt−1 and WLt+1) that are physically adjacent to the row of the hammer address HADDR (e.g., the middle word-line WLt), and an refresh operation for the adjacent word-lines WLt−1 and WLt+1 may be performed additionally based on (e.g., in response to) the hammer refresh address HREF_ADDR to reduce or possibly prevent the loss of data stored in the memory cells MC.

Figure 22:
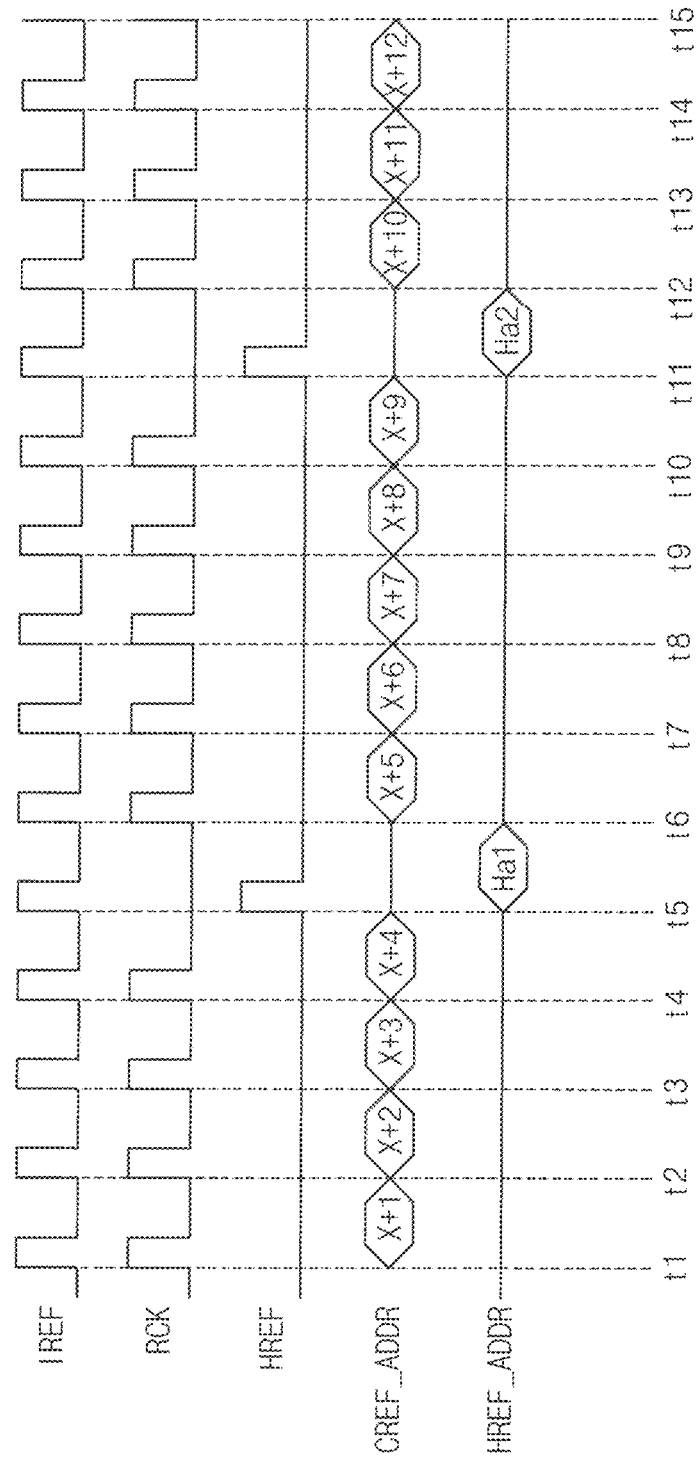
FIGS. 22 and 23 are timing diagrams illustrating example operations of a refresh control circuit of FIG. 8 according to example embodiments.
Figure 23:
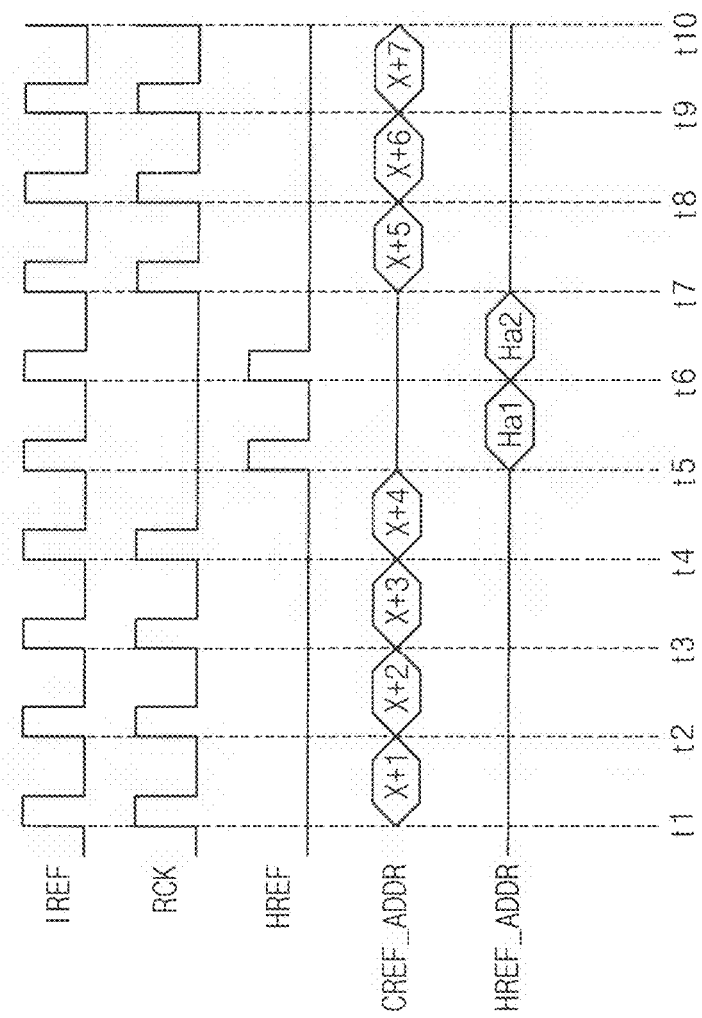

FIGS. 22 and 23 are timing diagrams illustrating example operations of a refresh control circuit of FIG. 8 according to example embodiments.

FIGS. 22 and 23 illustrate generations of a refresh clock signal RCK, a hammer refresh signal HREF, a counter refresh address CREF_ADDR, and a hammer refresh address HREF_ADDR, with respect to a refresh control signal IREF that is activated in a pulse shape. The intervals between the activation time points t1~t15 of the refresh control signal IREF may be regular or irregular.

Referring to FIGS. 8 and 22, the refresh control logic 410 may activate the refresh clock signal RCK in synchronization with some time points t1~t4, t6~t10 and t12~t15 among the activation time points t1~t15 of the refresh control signal IREF, and may activate the hammer refresh signal HREF with the other time points t5 and t11.

The refresh counter 430 may generate the counter refresh address CREF_ADDR representing the sequentially changing addresses X+1~X+15 in synchronization with the activation time points t1~t4, t6~t10 and t12~t15 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t11 of the hammer refresh signal HREF.

Referring to FIGS. 8 and 23, the refresh control logic 410 may activate the refresh clock signal RCK in synchronization with some time points t1~t4 and t7~t10 among the activation time points t1~t10 of the refresh control signal IREF, and may activate the hammer refresh signal HREF with the other time points t5 and t6.

The refresh counter 430 may generate the counter refresh address CREF_ADDR representing the sequentially changing addresses X+1~X+7 in synchronization with the activation time points t1~t4 and t7~t10 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t6 of the hammer refresh signal HREF.

Figure 24:
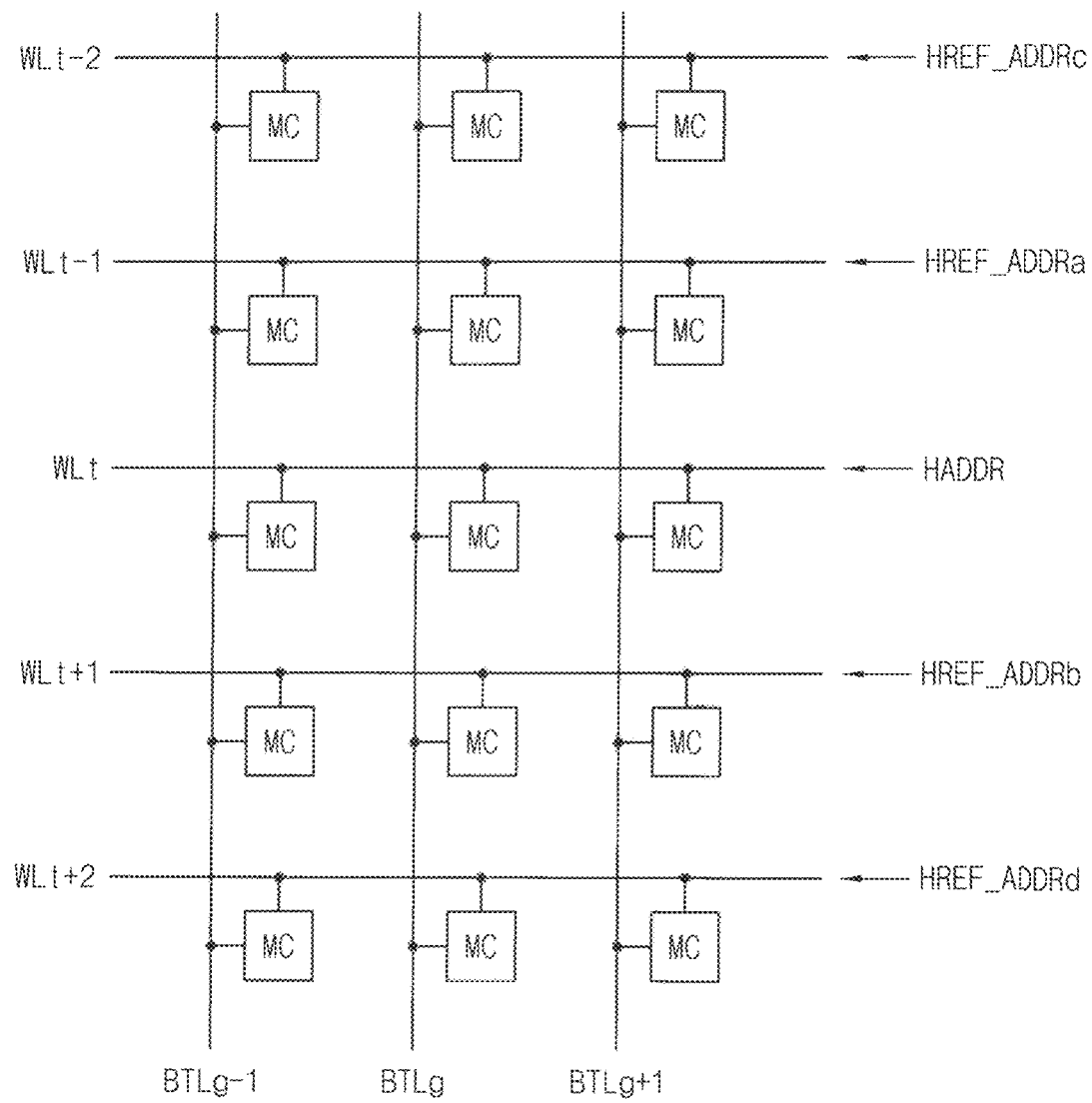
FIG. 24 is a diagram illustrating a portion of a memory cell array for describing generation of hammer refresh addresses.

FIG. 24 is a diagram illustrating a portion of a memory cell array for describing generation of hammer refresh addresses.

FIG. 24 illustrates five word-lines WLt−2 WLt−1, WLt, WLt+1 and WLt+2, three bit-lines BLg−1, BLg and BLg+1 and memory cells MC coupled to the word-lines WLt−2 WLt−1, WLt, WLt+1 and WLt+2 and the bit-lines BLg−1, BLg and BLg+1 in the memory cell array. The five word-lines WLt−2 WLt−1, WLt, WLt+1 and WLt+2 are extended in a row direction and arranged sequentially along a column direction.

The hammer address generator 440 in FIG. 9 may provide the HREF_ADDR representing addresses HREF_ADDRa, HREF-ADDRb, HREF_ADDRc and HREF-ADDRd of the rows (e.g., the word-lines WLt−2 WLt−1, WLt+1 and WLt+1) that are physically adjacent to the row of the hammer address HADDR (e.g., the middle word-line WLt), and a refresh operation for the adjacent word-lines WLt−2 WLt−1, WLt+1 and WLt+1 may be performed additionally based on (e.g., in response to) the hammer refresh address HREF_ADDR to reduce or possibly prevent the loss of data stored in the memory cells MC.

Figure 25:
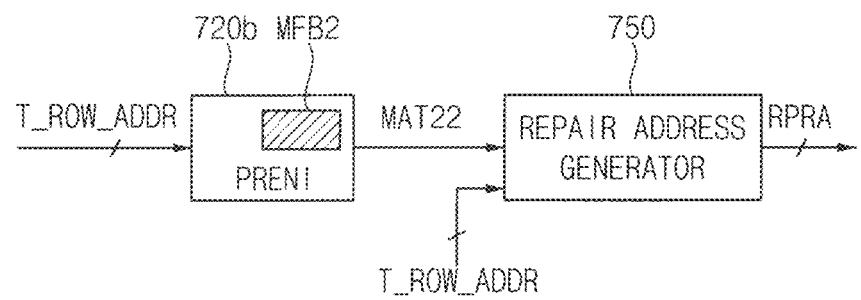
FIG. 25 is a diagram illustrating that the repair control circuit of FIG. 11 outputs the repair address according to example embodiments.

FIG. 25 is a diagram illustrating that the repair control circuit of FIG. 11 outputs the repair address according to example embodiments.

Referring to FIG. 25, the master fuse bit MFB2 stored in the repair controller 720b indicates that the register set in the repair controller 720b stores the defective addresses, and the repair controller 720b compares the target row address T_ROW_ADDR with the defective addresses stored therein and outputs the second matching signal MAT22 to the repair address generator 750 in response to the target row address T_ROW_ADDR matching one of the defective addresses. The repair address generator 750 may generate the repair address RPRA replacing the target row address T_ROW_ADDR based on the second matching signal MAT22.

Figure 26:
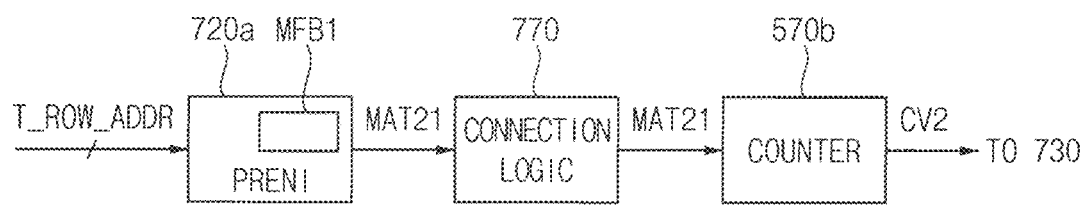
FIG. 26 is a diagram illustrating that the repair control circuit of FIG. 11 is used as a storage resource to store access addresses according to example embodiments.

FIG. 26 is a diagram illustrating that the repair control circuit of FIG. 11 is used as a storage resource to store access addresses according to example embodiments.

Referring to FIG. 26, the master fuse bit MFB1 stored in the repair controller 720a indicates that the register set in the repair controller 720a us unused for storing the defective addresses, and the repair controller 720a compares the target row address T_ROW_ADDR with the access addresses stored therein and outputs the second matching signal MAT21 to the corresponding counter 570b in response to the target row address T_ROW_ADDR matching one of the access addresses. The counter 570b increases counting value CV2 associated with the target row address T_ROW_ADDR and stores the counting value CV2 in the register set 730 in FIG. 13B.

Figure 27:
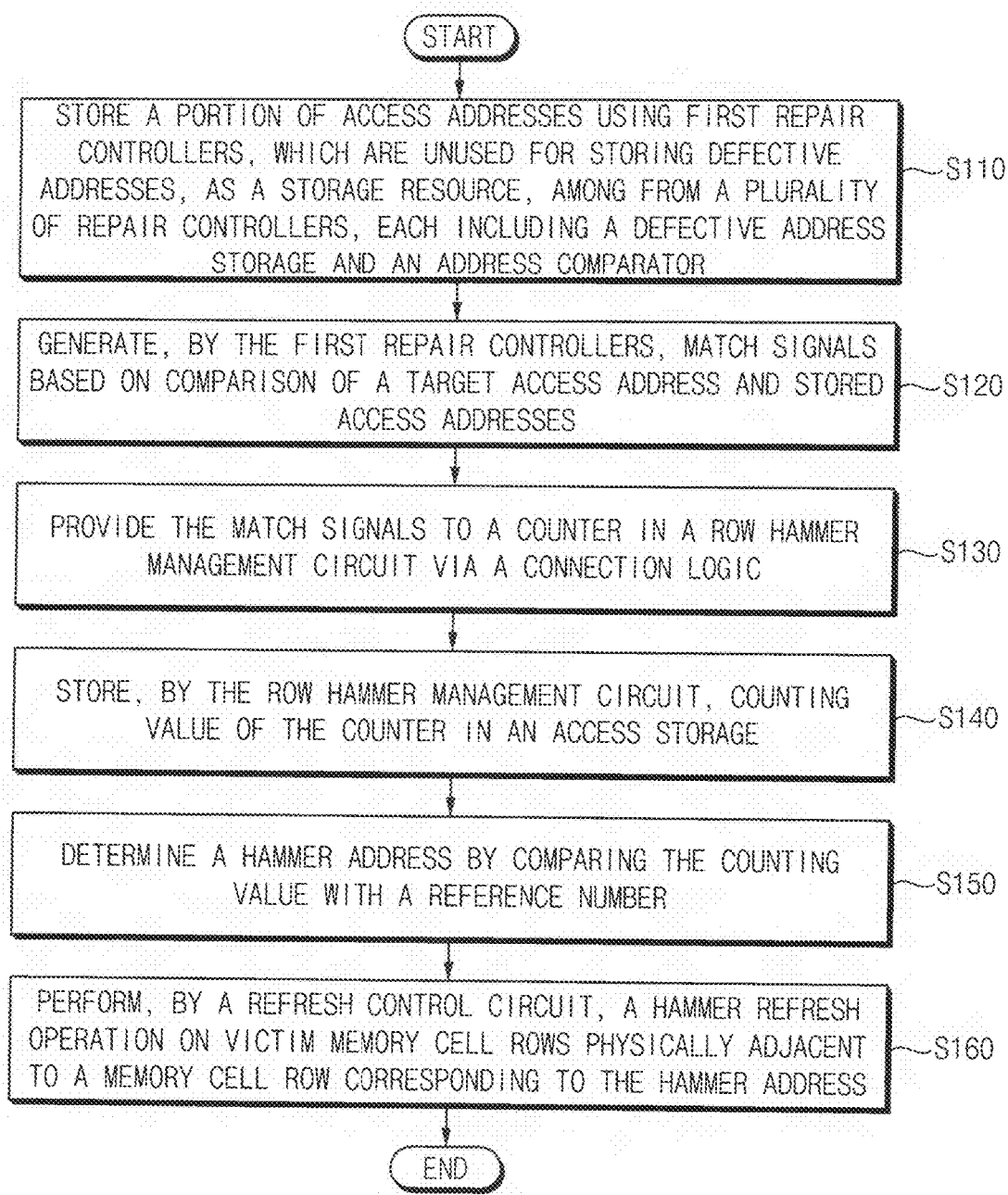
FIG. 27 is a flow chart illustrating an operating method of a semiconductor memory device according to example embodiments.

FIG. 27 is a flow chart illustrating an operating a semiconductor memory device according to example embodiments.

Referring to FIGS. 3 through 27, there is provided a method of operating a semiconductor memory device 200 including a memory cell array 310 that includes a plurality of memory cell rows each of which includes a plurality of volatile memory cells.

According to the method, first repair controllers, which are unused for storing defective addresses, among from a plurality of repair controllers each of which includes a defective address storage and an address comparator, store a portion of access addresses (operation S110).

At least one of the first repair controllers generates a (second) matching signal based on a comparison of a target access address and stored access addresses therein (Operation S120).

A connection logic 770 provides the matching signal to a corresponding counter in a row hammer management circuit 500 (operation S130).

The row hammer management circuit 500 stores a counting value of the corresponding counter in an access storage 520 (operation S140).

The row hammer management circuit 500 determines a hammer address HADDR based on comparing the counting value with a reference number (operation S150).

A refresh control circuit 400 performs a hammer refresh operation on victim memory cell rows which are physically adjacent to a memory cell row corresponding to the hammer address HADDR (operation S160).

In example embodiments, the connection logic 770 may identify the first repair controllers among from the plurality of repair controllers based master fuse bits, and each of the master fuse bits indicates whether a corresponding access address is stored therein. In addition, the connection logic 770 may connect the first repair controller to the row hammer management circuit 500.

As mentioned above, in the semiconductor memory device and the method of operating the semiconductor memory device, a portion of repair controllers store access addresses for managing row hammer in access storage therein, and provide matching signals to corresponding counters in the row hammer management circuit through the connection logic based on comparing the target access address and the access addresses and the row hammer management circuit determines whether the target access address corresponds to a hammer address. Therefore, efficiency of row hammer management may be enhanced by storing more access addresses without increasing a size of the row hammer management circuit.

Figure 28:
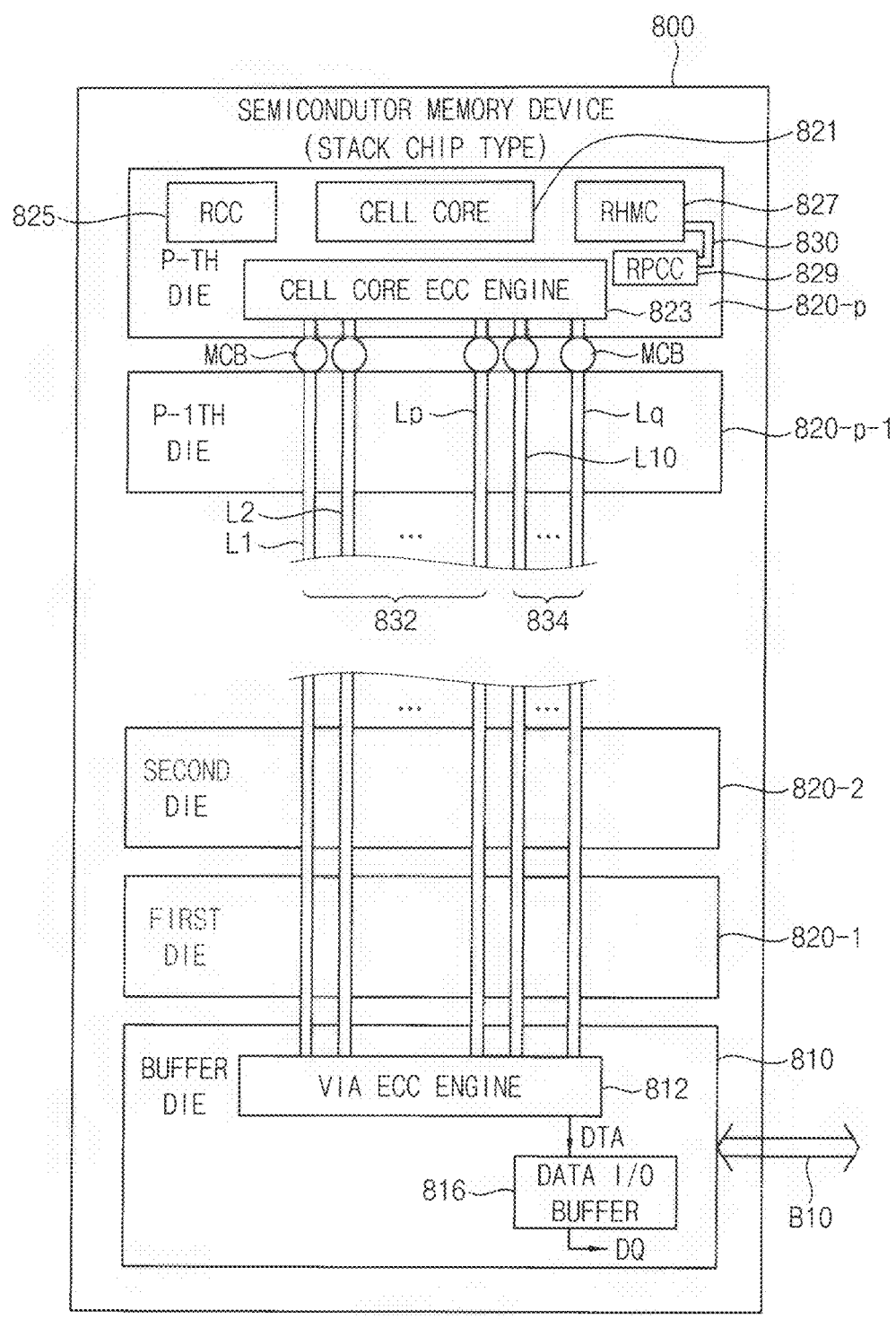
FIG. 28 is a block diagram illustrating a semiconductor memory device according to example embodiments.

FIG. 28 is a block diagram illustrating a semiconductor memory device according to example embodiments.

Referring to FIG. 28, a semiconductor memory device 800 may include at least one buffer die 810 and a plurality of memory dies 820-1 to 820-p (p is a natural number equal to or greater than three) providing a soft error analyzing and correcting function in a stacked chip structure.

The plurality of memory dies 820-1 to 820-p are stacked on the buffer die 810 and conveys data through a plurality of through silicon via (TSV) lines.

At least one of the memory dies 820-1 to 820-p may include a cell core 821 to store data, a cell core ECC engine 823 which generates transmission parity bits (e.g., transmission parity data) based on transmission data to be sent to the at least one buffer die 810, a refresh control circuit (RCC) 825, a row hammer management circuit (RHMC) 827, a repair control circuit (RPCC) 829 and a connection logic 830. The cell core 821 may include a plurality of memory cells having DRAM cell structure.

The refresh control circuit 825 may employ the refresh control circuit 400 of FIG. 8, the row hammer management circuit 827 may employ the row hammer management circuit 500 of FIG. 5 and the repair control circuit 829 may employ the repair control circuit 700 of FIG. 11.

Therefore, the repair control circuit 829 include a plurality of repair controllers, a portion of the repair controllers may store access addresses for managing row hammer in access storage therein, and provide matching signals to corresponding counters in the row hammer management circuit 827 through the connection logic 830 based on comparing the target access address and the access addresses and the row hammer management circuit 827 may determine whether the target access address corresponds to a hammer address. Therefore, efficiency of row hammer management may be enhanced by storing more access addresses without increasing a size of the row hammer management circuit 827.

The buffer die 810 may include a via ECC engine 812 which corrects a transmission error using the transmission parity bits when a transmission error is detected from the transmission data received through the TSV liens and generates error-corrected data.

The buffer die 810 may further include and a data I/O buffer 816. The data I/O buffer 816 may generate the data signal DQ by sampling the data DTA from the via ECC engine 812 and may output the data signal DQ to an outside.

The semiconductor memory device 800 may be a stack chip type memory device or a stacked memory device which conveys data and control signals through the TSV lines. The TSV lines may be also called 'through electrodes'.

The cell core ECC engine 823 may perform error correction on data which is outputted from the memory die 820-p before the transmission data is sent.

A data TSV line group 832 which is formed at one memory die 820-p may include 128 TSV lines L1 to Lp, and a parity TSV line group 834 may include 8 TSV lines L10 to Lq. The TSV lines L1 to Lp of the data TSV line group 832 and the parity TSV lines L10 to Lq of the parity TSV line group 834 may be connected to micro bumps MCB which are correspondingly formed among the memory dies 820-1 to 820-p.

The semiconductor memory device 800 may have a three-dimensional (3D) chip structure or a 2.5D chip structure to communicate with the host through a data bus B10. The buffer die 810 may be connected with the memory controller through the data bus B10.

According to example embodiments, as illustrated in FIG. 28, the cell core ECC engine 823 may be included in the memory die, the via ECC engine 812 may be included in the buffer die. Accordingly, it may be possible to detect and correct soft data fail. The soft data fail may include a transmission error which is generated due to noise when data is transmitted through TSV lines.

Figure 29:
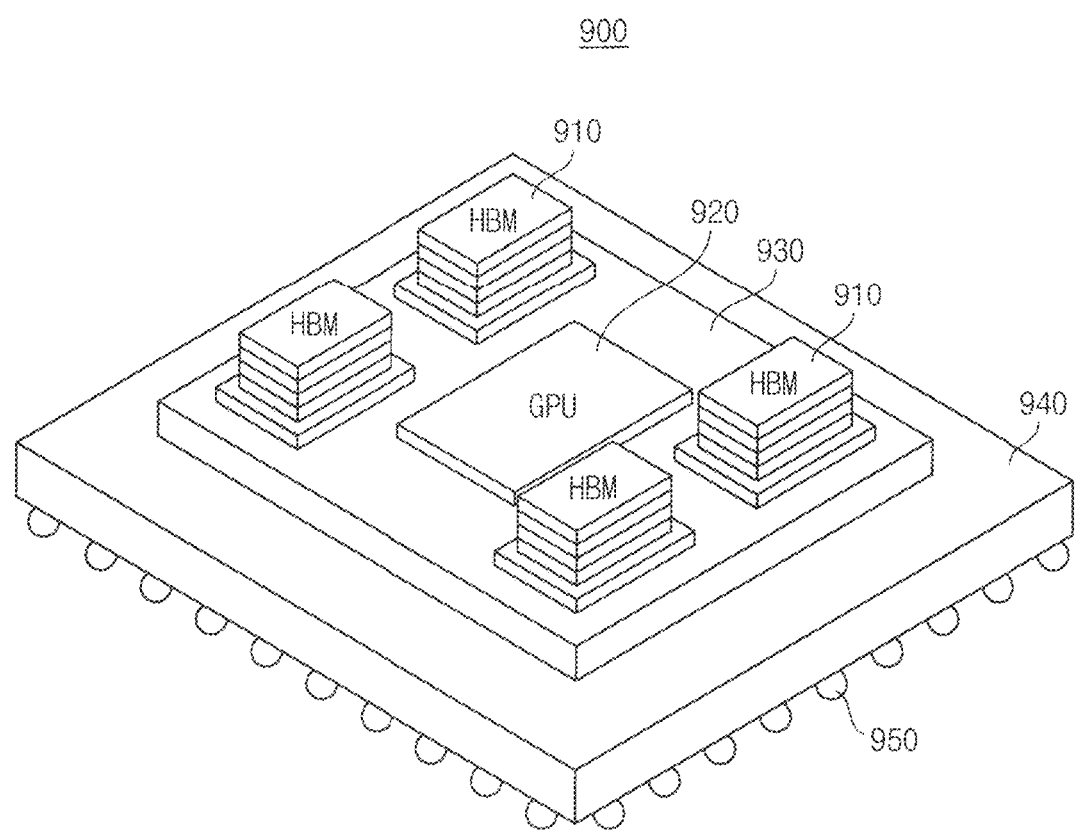
FIG. 29 is a configuration diagram illustrating a semiconductor package including the stacked memory device according to example embodiments.

FIG. 29 is a configuration diagram illustrating a semiconductor package including the stacked memory device according to example embodiments.

Referring to FIG. 29, a semiconductor package 900 may include one or more stacked memory devices 910 and a graphic processing unit (GPU) 920.

The stacked memory devices 910 and the GPU 920 may be mounted on an interposer 930, and the interposer on which the stacked memory device 910 and the GPU 920 are mounted may be mounted on a package substrate 940 mounted on solder balls 950. The GPU 920 may correspond to a semiconductor device which may perform a memory control function, and for example, the GPU 920 may be implemented as an application processor (AP). The GPU 920 may include a memory controller having a scheduler.

The stacked memory device 910 may be implemented in various forms, and the stacked memory device 910 may be a memory device in a high bandwidth memory (HBM) form in which a plurality of layers are stacked. Accordingly, the stacked memory device 910 may include a buffer die and a plurality of memory dies and each of the plurality of memory dies include a refresh control circuit, a row hammer management circuit, a repair control circuit and a connection logic.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. Meanwhile, when the stacked memory device 910 includes a direct access region, a test signal may be provided into the stacked memory device 910 through conductive means (e.g., solder balls 950) mounted under package substrate 940 and the direct access region.

Aspects of the present inventive concepts may be applied to systems using semiconductor memory devices that employ volatile memory cells. For example, aspects of the present inventive concepts may be applied to systems such as, a smart phone, a navigation system, a notebook computer, a desk top computer and a game console that use the semiconductor memory device as a working memory.

Any of the elements disclosed herein that process (and/or perform) at least one function or operation may be included in and/or implemented as (and/or in) processing circuitry such hardware, software, or the combination of hardware and software. For example, the processing circuitry more specifically may include (and/or be included in), but is not limited to, a processor (and/or processors), Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims.

What is claimed is:

1. A semiconductor memory device comprising:
   a memory cell array including a plurality of memory cell rows, each including a plurality of volatile memory cells;
   a row hammer management circuit configured to:
     count each of access addresses associated with access to each of the plurality of memory cell rows to store counting values therein; and
     determine a hammer address associated with at least one of the plurality of memory cell rows, which is intensively accessed, based on the counting values;
   a repair control circuit including a plurality of repair controllers, each of the plurality of repair controllers configured to store a defective address storage, the repair control circuit configured to repair a defective memory cell row among from the plurality of memory cell rows; and
   a connection logic configured to connect first repair controllers to the row hammer management circuit, the first repair controllers being a portion of the plurality of repair controllers unused for storing defective addresses,
   wherein the row hammer management circuit is configured to use the first repair controllers as a storage resource to store a portion of the access addresses.

2. The semiconductor memory device of claim 1, wherein the row hammer management circuit includes:
   an access storage configured to store the access addresses and the counting values corresponding to the access addresses; and
   an access storage controller configured to control the access storage and configured to determine the hammer address based on the counting values.

3. The semiconductor memory device of claim 2, wherein the access storage controller includes:
   a first address comparator configured to compare a target row address of a target access address with respective one of first row addresses stored in the access storage to generate a first matching signal, the target access address designating a memory cell row which is currently accessed among from the plurality of memory cell rows;
   a counter circuit including a plurality of counters configured to generate the counting value based on the first matching signal and second matching signals provided from the first repair controllers and configured to store the counting values in the access storage; and
   a monitor logic connect to the access storage, the monitor logic configured to:

selectively store the target row address in the access storage based on the first matching signal and the second matching signals; and determine the hammer address based on comparing with a counting value of the target row address with a reference number.

4. The semiconductor memory device of claim 3, wherein the plurality of repair controllers include:
the first repair controllers; and
second repair controllers configured to store the defective addresses.

5. The semiconductor memory device of claim 4, wherein the connection logic is configured to identify the first repair controllers and the second repair controllers based on master fuse bits stored in each of the plurality of repair controllers.

6. The semiconductor memory device of claim 5, wherein each of the first repair controllers includes:
a register set configured to store the master fuse bits and the portion of the access addresses, the master fuse bit indicating whether a corresponding access address is stored therein; and
a second address comparator configured to compare the target row address with respective one of the row addresses stored in the access storage to generate a corresponding one of the second matching signals.

7. The semiconductor memory device of claim 6, wherein the connection logic is configured to provide the corresponding second matching signal to corresponding one of the plurality of counters.

8. The semiconductor memory device of claim 6, wherein the connection logic is configured to vary a number of the first repair controllers connected to a portion of the plurality of counters based on the master fuse bits.

9. The semiconductor memory device of claim 3, wherein the monitor logic is configured to store the target row address in the access storage in response to the first matching signal indicating that the target row address does not match respective one of the row addresses stored in the access storage.

10. The semiconductor memory device of claim 1, wherein the connection logic includes:
a switch matrix including first terminals connected to the plurality of repair controllers and second terminals connected to a plurality of counters in the row hammer management circuits, the switch matrix configured to connect the first repair controllers to corresponding counters among from the plurality of counters through the first terminals and the second terminals, based on switching control signals; and
a switching signal generator configured to generate the switching control signals based on master fuse bits, each of the master fuse bits indicating whether a corresponding access address is stored.

11. The semiconductor memory device of claim 1, further comprising:
a refresh control circuit configured to perform a refresh operation on the plurality of memory cell rows and a hammer refresh operation on victim memory cell rows which are physically adjacent to a memory cell row corresponding to the hammer address.

12. The semiconductor memory device of claim 11, wherein the refresh control circuit includes:
a refresh control logic configured to generate a hammer refresh signal in response to a hammer event detection signal associated with the hammer address;
a refresh clock generator configured to generate a refresh clock signal in response to a refresh signal;

a refresh counter configured to generate a count refresh address associated with the normal refresh operation on the plurality of memory cell rows based on the refresh clock signal;
a hammer address storage configured to store the hammer address and configured to output the hammer address in response to the hammer refresh signal; and
a mapper configured to generate hammer refresh addresses designating addresses of the victim memory cell rows based on the hammer address output from the hammer address storage.

13. The semiconductor memory device of claim 12, wherein the mapper is configured to generate at least two hammer refresh addresses based on the hammer address.

14. The semiconductor memory device of claim 11, wherein:
each of the access addresses is accompanied by an active command provided from a memory controller; and
the a row hammer management circuit is configured to determine the hammer address in response to a pre-charge command which is applied from the memory controller after the active command.

15. The semiconductor memory device of claim 1, further comprising:
a nonvolatile storage configured to store the defective addresses, and
wherein the nonvolatile storage is configured to provide the defective addresses to the repair control circuit during a power-up sequence of the semiconductor memory device.

16. The semiconductor memory device of claim 1, wherein the memory cell array includes:
a normal cell array including a plurality of normal memory cells and connected to a plurality of word-lines; and
a redundancy cell array including a plurality of redundancy memory cells and connected to a plurality of redundancy word-lines, and
wherein, in response to a target row address of a target access address matching one of the defective addresses, the target access address designating a memory cell row which is currently accessed among from the plurality of memory cell rows, the repair control circuit is configured to output a repair address replacing the target access address and designating one of the plurality of redundancy word-lines.

17. The semiconductor memory device of claim 1, wherein:
the memory cell array includes a plurality of bank arrays;
the plurality of repair controllers are divided into a plurality of groups corresponding to the plurality of bank arrays,
the row hammer management circuit is configured to use a first group of repair controllers corresponding to a first bank array among from the plurality of bank arrays as a bank storage resource to store access addresses associated with a second bank array among from the plurality of bank arrays.

18. A method of operating a semiconductor memory device including a memory cell array that includes a plurality of memory cell rows, each including a plurality of volatile memory cells, the method comprising:
storing a portion of access addresses by using first repair controllers, which are unused for storing defective addresses, among from a plurality of repair controllers, each including a defective address storage;

generating, by at least one of the first repair controllers, a matching signal based on a comparison of a target access address and stored access addresses therein;

providing, by a connection logic, the matching signal to a corresponding counter in a row hammer management circuit;

storing, by the row hammer management circuit, a counting value of the corresponding counter in an access storage;

determining, by the row hammer management circuit, a hammer address based on comparing the counting value with a reference number; and performing, by a refresh control circuit, a hammer refresh operation on victim memory cell rows which are physically adjacent to a memory cell row corresponding to the hammer address.

19. The method of claim 18, further comprising:

identifying, by the connection logic, the first repair controllers among from the plurality of repair controllers based on master fuse bits, each indicating whether a corresponding access address is stored therein; and connecting, by the connection logic, the first repair controllers to the row hammer management circuit.

20. A semiconductor memory device comprising:

a memory cell array including a plurality of memory cell rows, each including a plurality of volatile memory cells;

a row hammer management circuit configured to:
  count each of access addresses associated with access to each of the plurality of memory cell rows to store counting values therein; and
  determine a hammer address associated with at least one of the plurality of memory cell rows, which is intensively accessed, based on the counting values;

a refresh control circuit configured to perform a refresh operation on the plurality of memory cell rows and a hammer refresh operation on victim memory cell rows which are physically adjacent to a memory cell row corresponding to the hammer address;

a repair control circuit including a plurality of repair controllers, each of the plurality of repair controllers configured to store a defective address storage, the repair control circuit configured to repair a defective memory cell row among from the plurality of memory cell rows; and a connection logic configured to connect the row hammer management circuit to first repair controllers, the first repair controllers being a portion of the plurality of repair controllers unused for storing defective addresses, wherein the row hammer management circuit is configured to manage row hammers of the plurality of memory cell rows by using the first repair controllers as a storage resource to store a portion of the access addresses.

* * * * *